United States Patent
Greenlee et al.

(10) Patent No.: US 11,195,848 B2
(45) Date of Patent: Dec. 7, 2021

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Jordan D. Greenlee, Boise, ID (US); Daniel Billingsley, Meridian, ID (US); Indra V. Chary, Boise, ID (US); Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/550,250

(22) Filed: Aug. 25, 2019

(65) Prior Publication Data
US 2021/0057440 A1    Feb. 25, 2021

(51) Int. Cl.
| | |
|---|---|
| *H01L 27/11582* | (2017.01) |
| *H01L 27/11556* | (2017.01) |
| *H01L 27/11519* | (2017.01) |
| *H01L 27/11565* | (2017.01) |
| *H01L 29/66* | (2006.01) |

(Continued)

(52) U.S. Cl.
CPC .... *H01L 27/11582* (2013.01); *H01L 21/0217* (2013.01); *H01L 21/02164* (2013.01); *H01L 21/02636* (2013.01); *H01L 21/31111* (2013.01); *H01L 27/11519* (2013.01);
(Continued)

(58) Field of Classification Search
CPC ......... H01L 27/11582; H01L 27/11519; H01L 27/11556; H01L 27/111565; H01L 21/02164; H01L 21/0217; H01L 21/02636; H01L 21/31111; H01L 29/66545
See application file for complete search history.

(56) References Cited

U.S. PATENT DOCUMENTS 6,066,869 A * 5/2000 Noble .............. H01L 27/10838
257/296
8,492,278 B2  7/2013 Good et al.
(Continued)

OTHER PUBLICATIONS

U.S. Appl. No. 16/599,856, filed Oct. 11, 2019 by Billingsley el al.
(Continued)

*Primary Examiner* — Seahvosh Nikmanesh
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Upper masses comprise first material laterally-between and longitudinally-spaced-along immediately-laterally-adjacent of the memory blocks and second material laterally-between and longitudinally-spaced-along the immediately-laterally-adjacent memory blocks longitudinally-between and under the upper masses. The second material is of different composition from that of the first material. The second material comprises insulative material. Other embodiments, including method, are disclosed.

33 Claims, 33 Drawing Sheets

(51) Int. Cl.
  *H01L 21/02* (2006.01)
  *H01L 21/311* (2006.01)
(52) U.S. Cl.
  CPC .. *H01L 27/11556* (2013.01); *H01L 27/11565* (2013.01); *H01L 29/66545* (2013.01)

(56) References Cited

U.S. PATENT DOCUMENTS

| | | | |
|---|---|---|---|
| 8,735,216 | B2 | 3/2014 | Liu et al. |
| 8,980,752 | B2 | 3/2015 | Good et al. |
| 9,786,673 | B1 | 10/2017 | Cho et al. |
| 9,893,083 | B1 | 2/2018 | Wang et al. |
| 10,014,309 | B2 | 7/2018 | Dorhout et al. |
| 10,381,377 | B2 | 8/2019 | Wang et al. |
| 10,388,665 | B1 | 8/2019 | Xie et al. |
| 10,553,607 | B1 | 2/2020 | Howder et al. |
| 2008/0014761 | A1 | 1/2008 | Bhatia et al. |
| 2011/0298013 | A1 | 12/2011 | Hwang et al. |
| 2012/0052672 | A1 | 3/2012 | Nakanishi et al. |
| 2012/0098050 | A1 | 4/2012 | Shim et al. |
| 2013/0009236 | A1 | 1/2013 | Lee et al. |
| 2013/0140623 | A1 | 6/2013 | Lee et al. |
| 2015/0206900 | A1 | 7/2015 | Nam et al. |
| 2015/0214241 | A1 | 7/2015 | Lee |
| 2015/0318301 | A1 | 11/2015 | Lee et al. |
| 2015/0340377 | A1 | 11/2015 | Lee |
| 2016/0204117 | A1 | 7/2016 | Liu et al. |
| 2016/0268302 | A1 | 9/2016 | Lee et al. |
| 2016/0343726 | A1 | 11/2016 | Yune |
| 2017/0062470 | A1 | 3/2017 | Han et al. |
| 2017/0148805 | A1 | 5/2017 | Nishikawa et al. |
| 2017/0278859 | A1 | 9/2017 | Sharangpani et al. |
| 2018/0047739 | A1 | 2/2018 | Dorhout et al. |
| 2018/0130814 | A1 | 5/2018 | Lee |
| 2018/0261615 | A1 | 9/2018 | Minemura |
| 2018/0294273 | A1 | 10/2018 | Liao et al. |
| 2018/0342528 | A1 | 11/2018 | Lee |
| 2019/0019724 | A1 | 1/2019 | Cheng et al. |
| 2019/0067182 | A1 | 2/2019 | Lee |
| 2019/0088671 | A1 | 3/2019 | Greenlee et al. |
| 2019/0237476 | A1 | 8/2019 | Lee et al. |
| 2019/0312054 | A1 | 10/2019 | Yun et al. |
| 2019/0363100 | A1 | 11/2019 | Lee et al. |
| 2020/0098781 | A1 | 3/2020 | Xiao |
| 2020/0127005 | A1 | 4/2020 | Otsu et al. |
| 2020/0194373 | A1 | 6/2020 | Baek et al. |
| 2020/0295031 | A1 | 9/2020 | Lue |
| 2020/0312863 | A1* | 10/2020 | Iwai .................. H01L 27/11524 |
| 2020/0388629 | A1 | 12/2020 | Lee et al. |
| 2020/0402890 | A1 | 12/2020 | Chary et al. |
| 2021/0043640 | A1 | 2/2021 | Kawaguchi et al. |
| 2021/0043647 | A1 | 2/2021 | Kim et al. |
| 2021/0050364 | A1 | 2/2021 | Tapias et al. |

OTHER PUBLICATIONS

U.S. Appl. No. 16/550,252, filed Aug. 25, 2019 by Xu et al.
U.S. Appl. No. 16/657,498, filed Oct. 18, 2019 by King et al.
U.S. Appl. No. 16/663,683, filed Oct. 25, 2019 by Machkaoutsan et al.
U.S. Appl. No. 16/664,618, filed Oct. 25, 2019 by Hu et al.
Jang et al., "Vertical Cell Array using TCAT (Terabit Cell Array Transistor) Technology for Ultra High Density NAND Flash Memory", IEEE, Symposium on VLSI Technology Digest of Technical Papers, United States, 2009, pp. 192-193.
U.S. Appl. No. 16/545,375, filed Aug. 20, 2019 by Zhang et al.
U.S. Appl. No. 16/550,238, filed Aug. 25, 2019 by Hu et al.
U.S. Appl. No. 16/550,244, filed Aug. 25, 2019 by Tessariol et al.
U.S. Appl. No. 16/728,962, filed Dec. 27, 2019, by Scarbrough et al.
U.S. Appl. No. 16/739,581, filed Jan. 10, 2020, by Tiwari.
U.S. Appl. No. 17/231,895, filed Apr. 15, 2021, by Chandolu et al.

\* cited by examiner

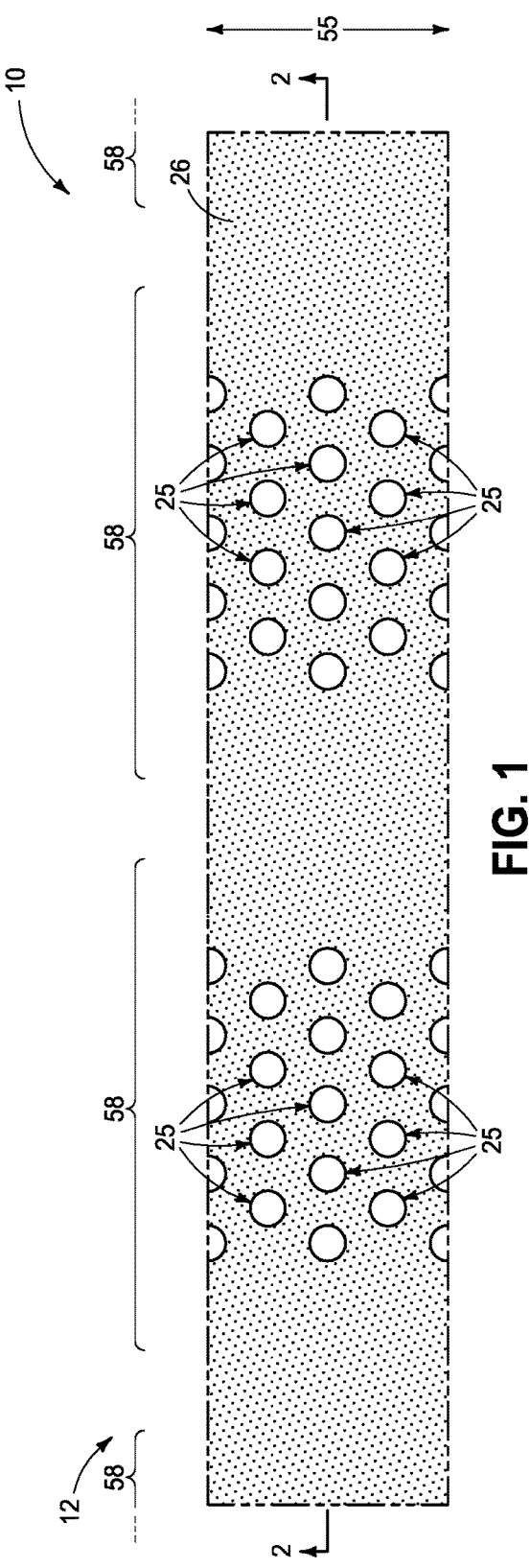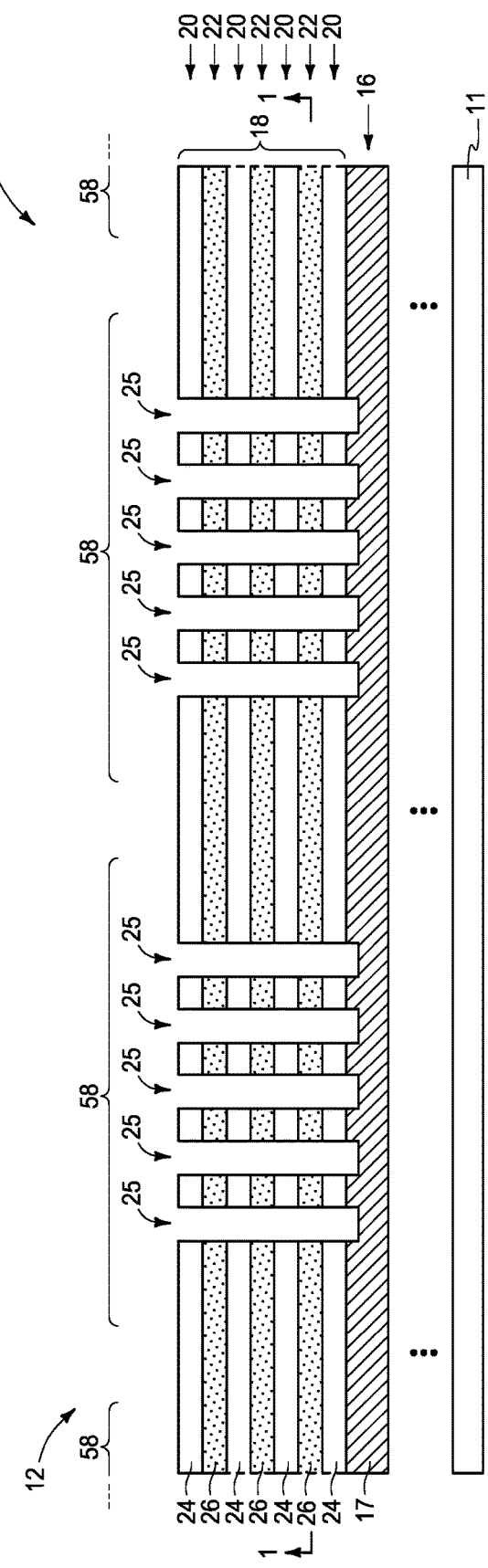

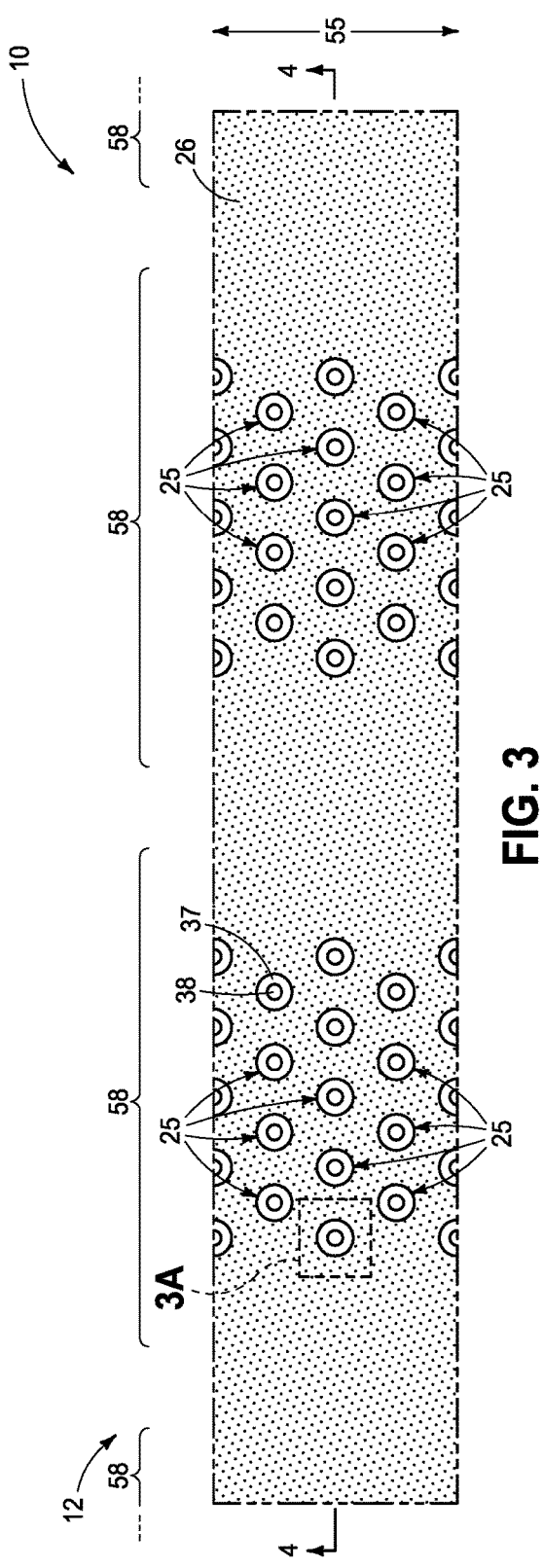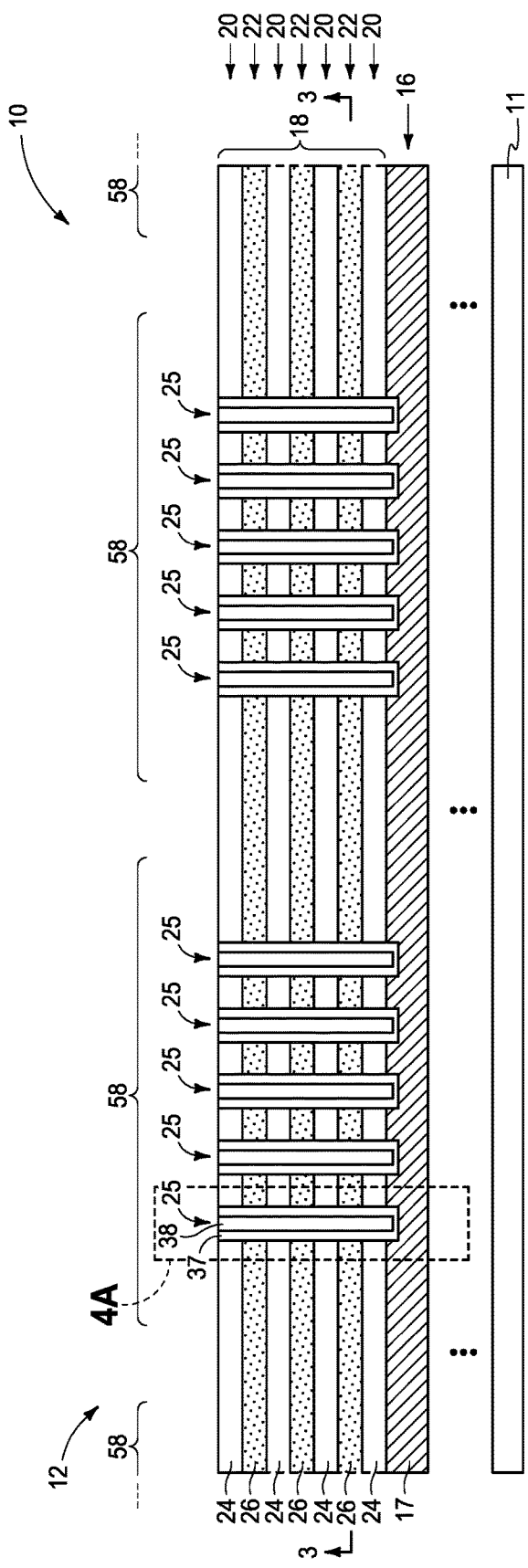

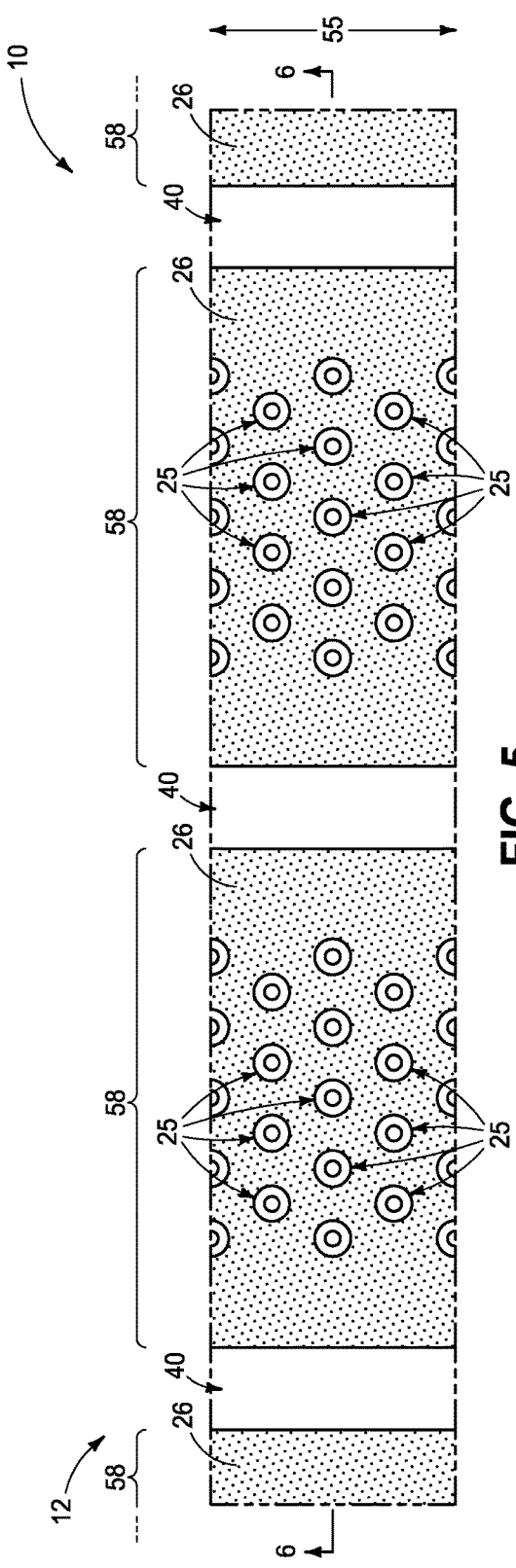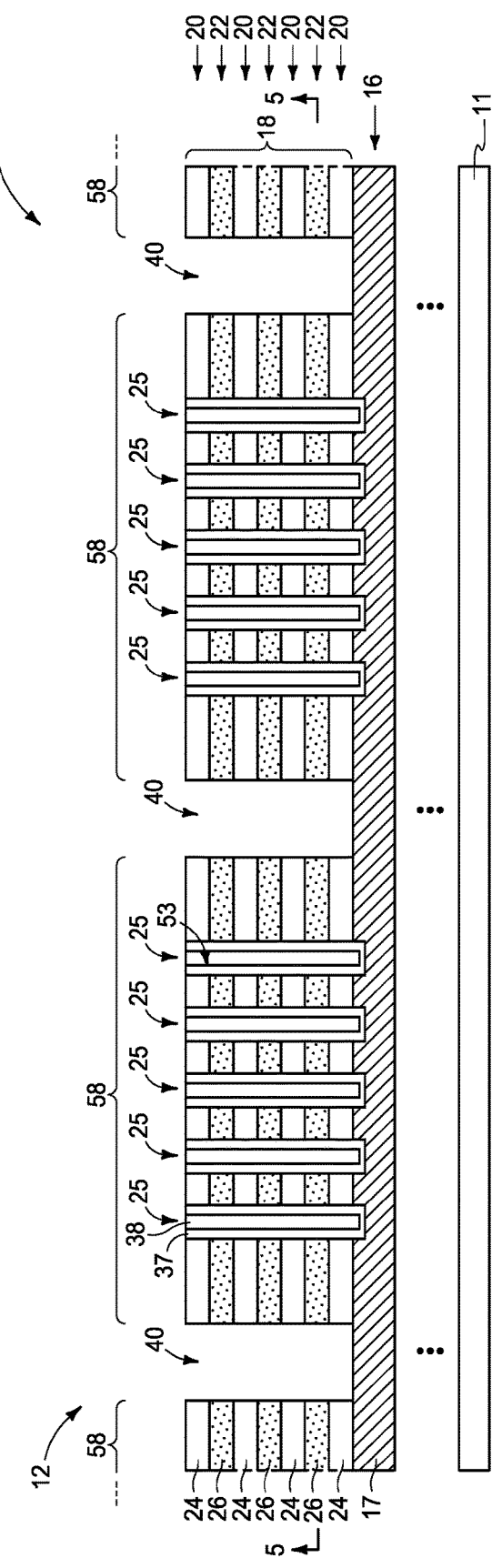
FIG. 5
FIG. 6

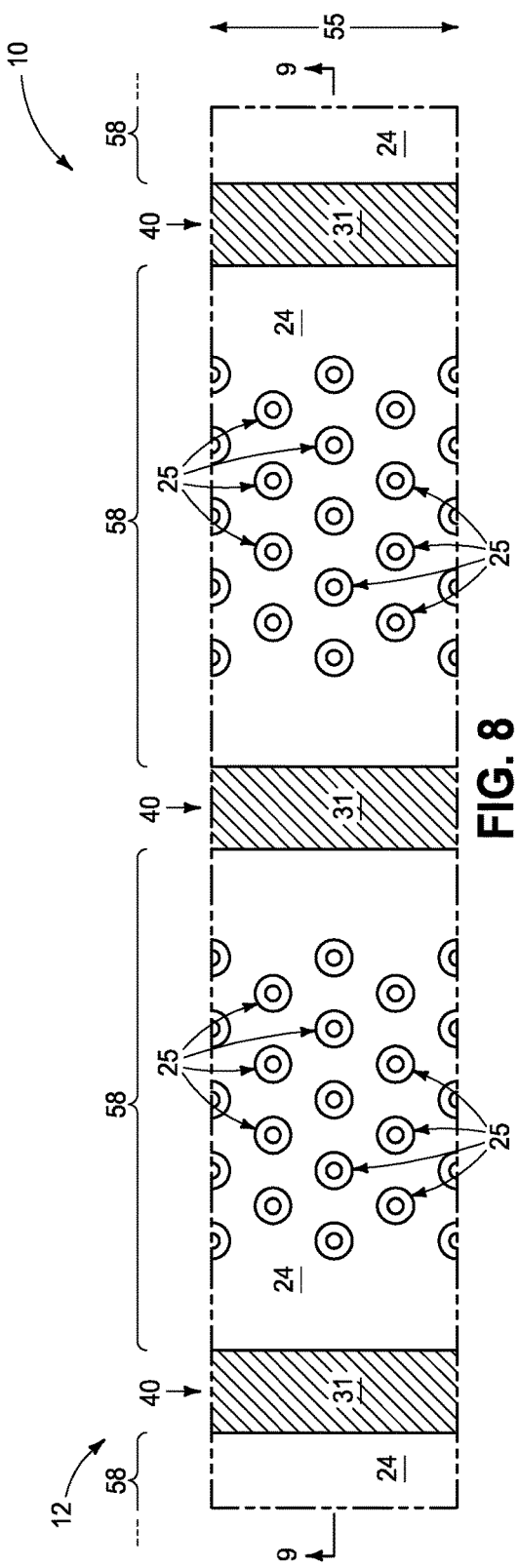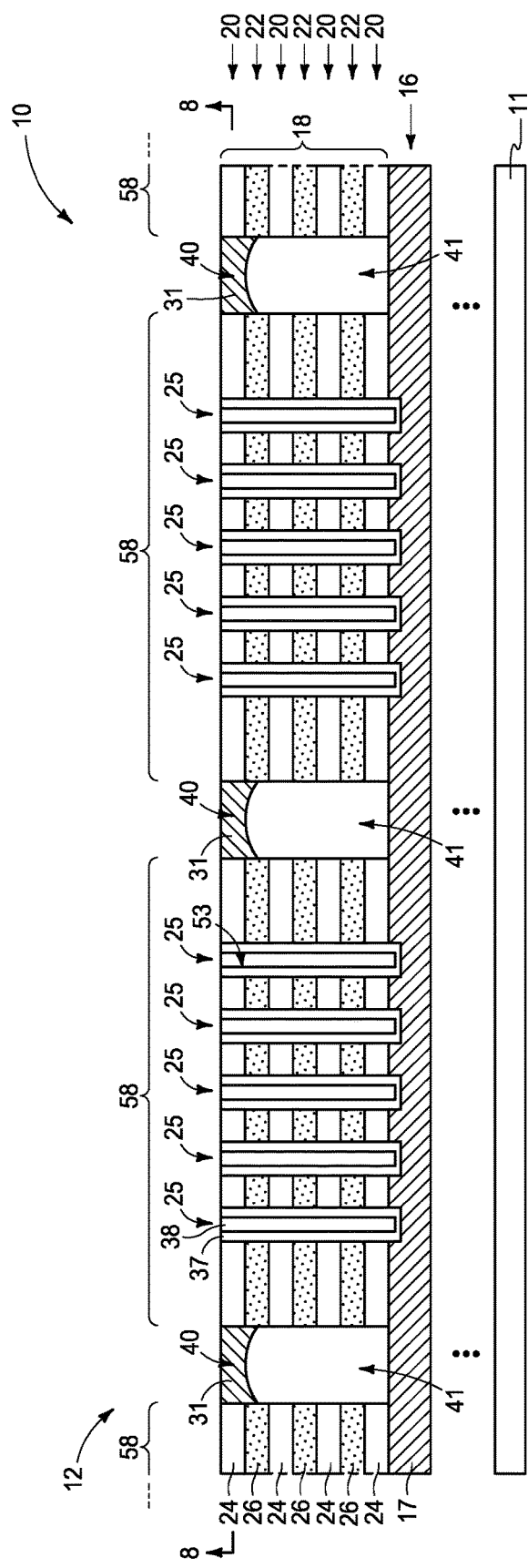

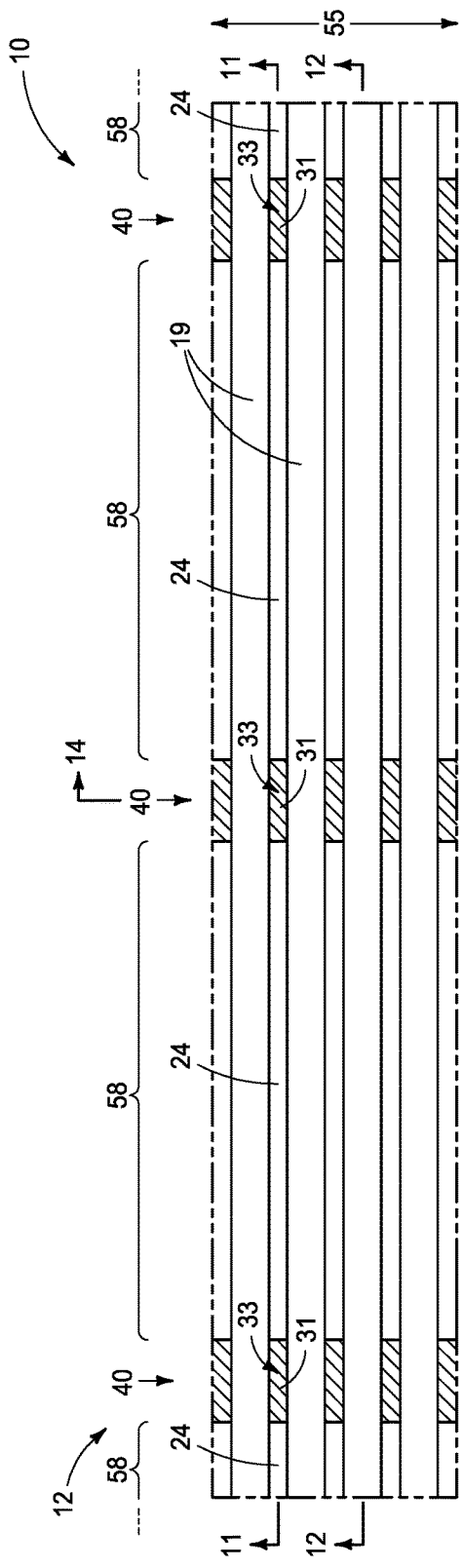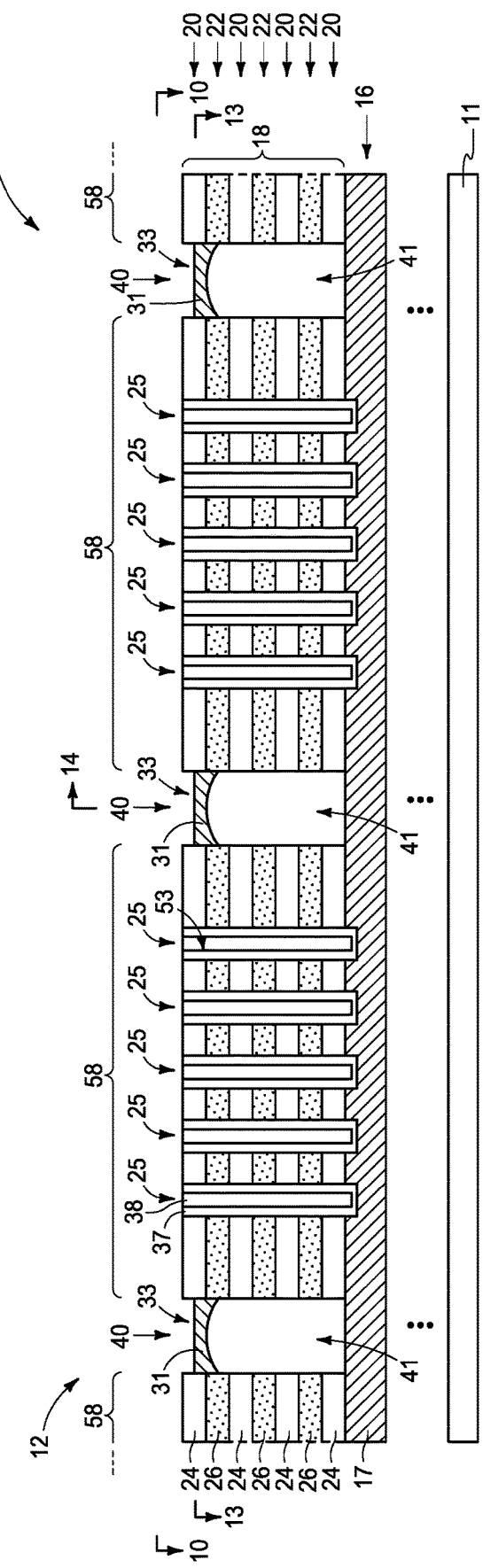

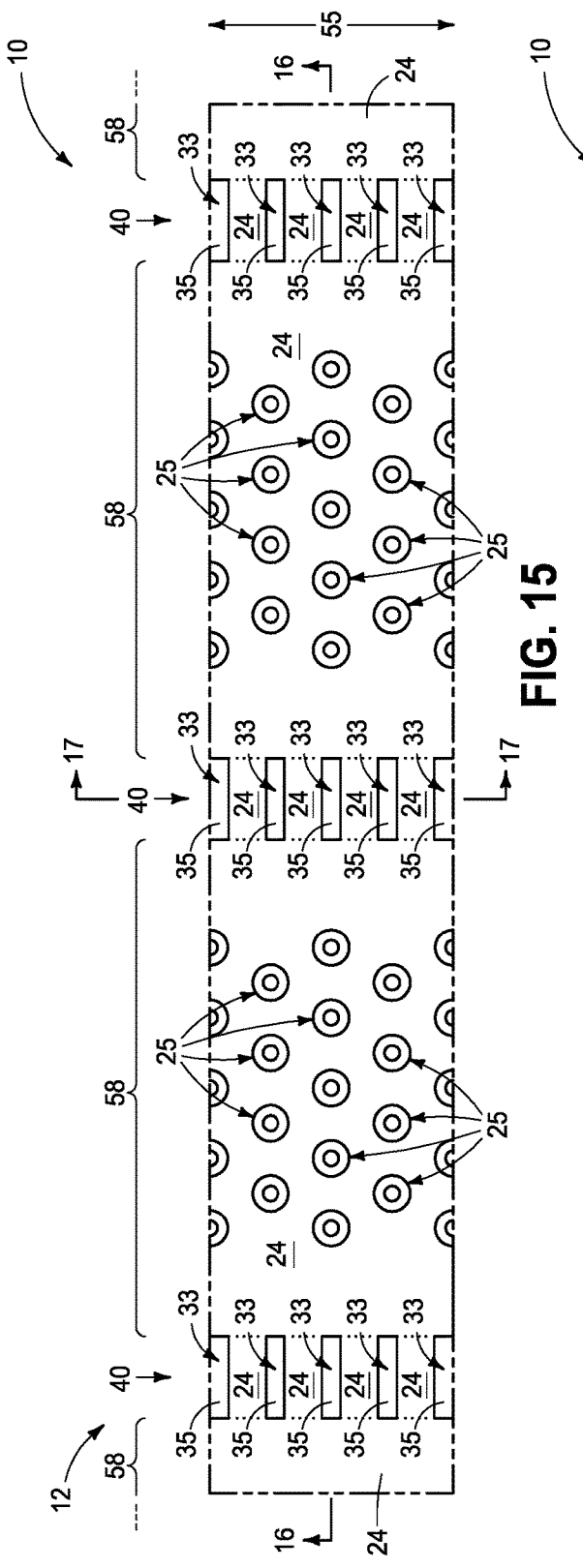
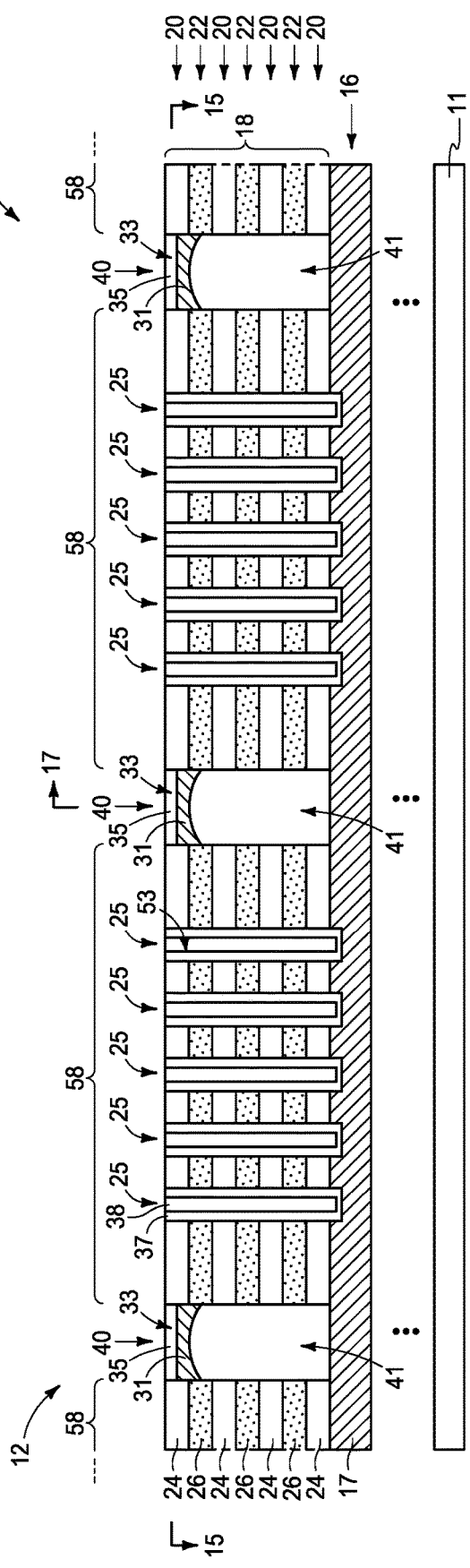
FIG. 15
FIG. 16

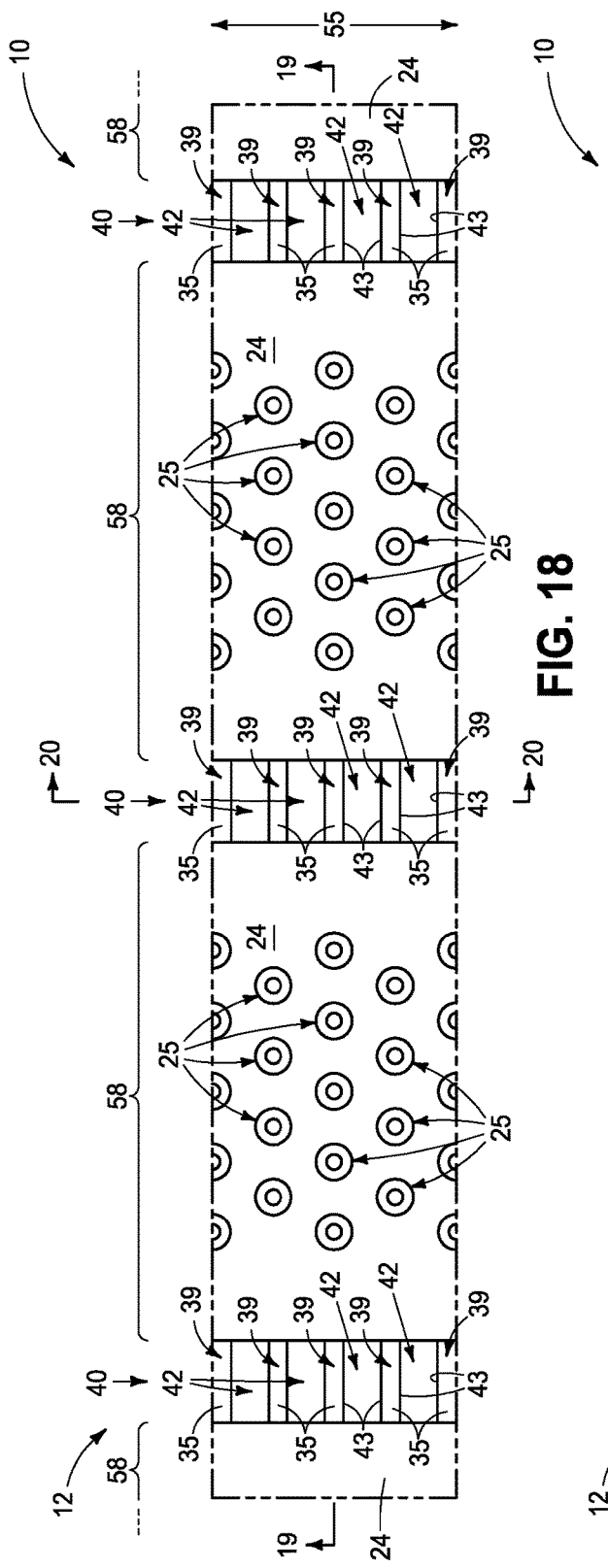
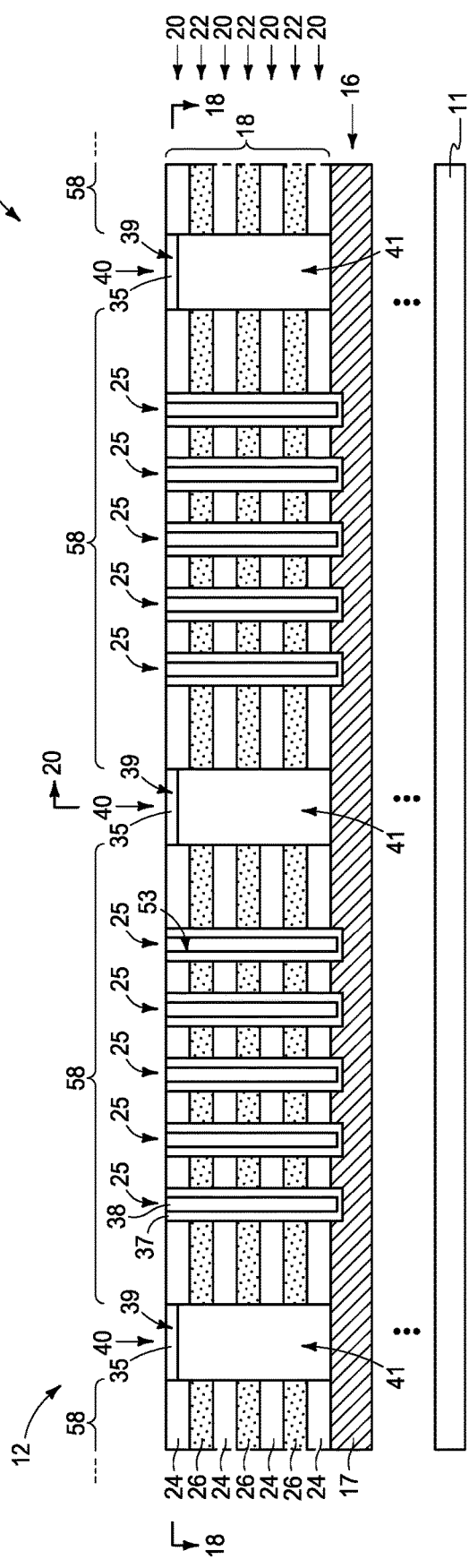
FIG. 18
FIG. 19

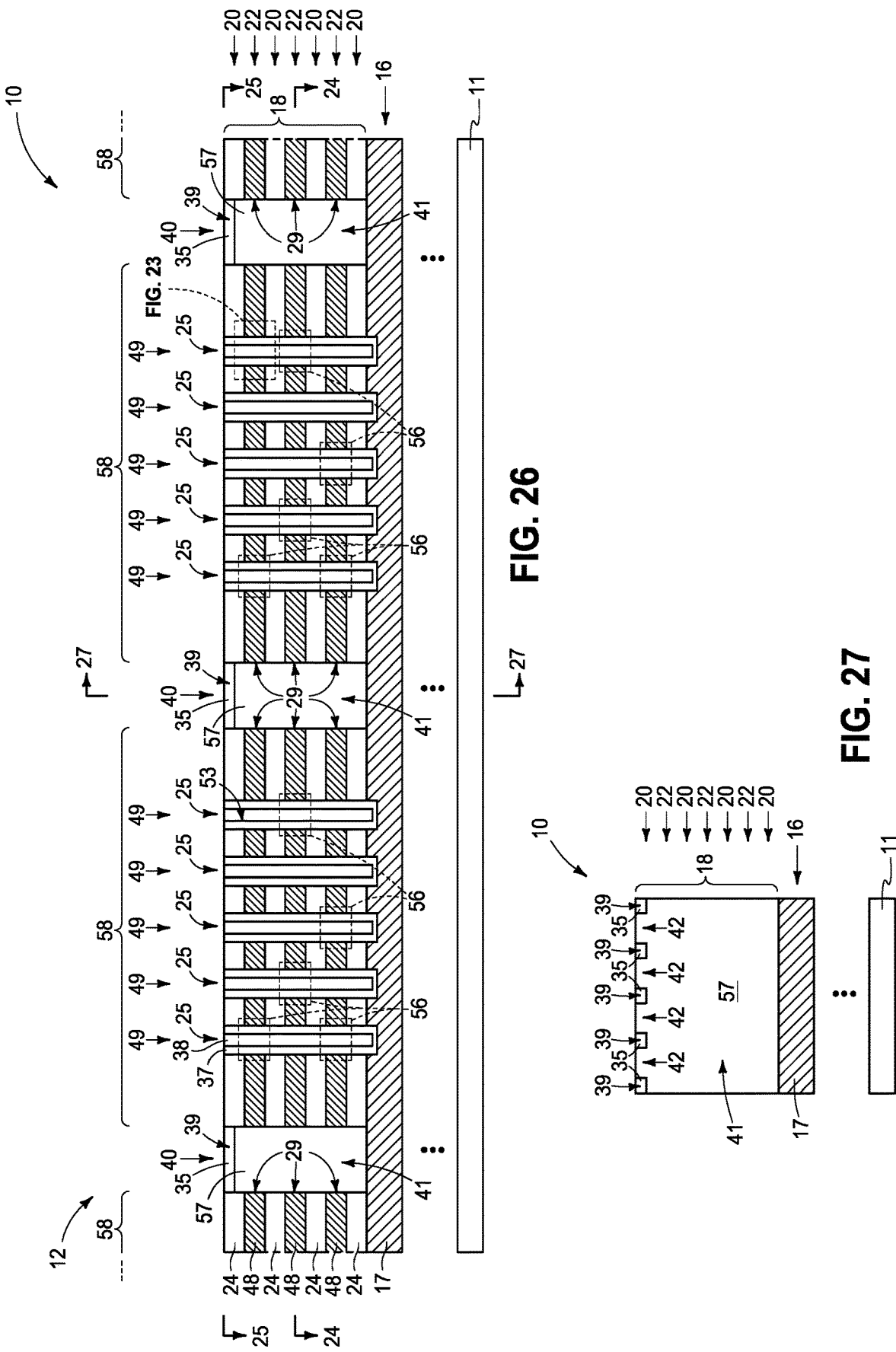

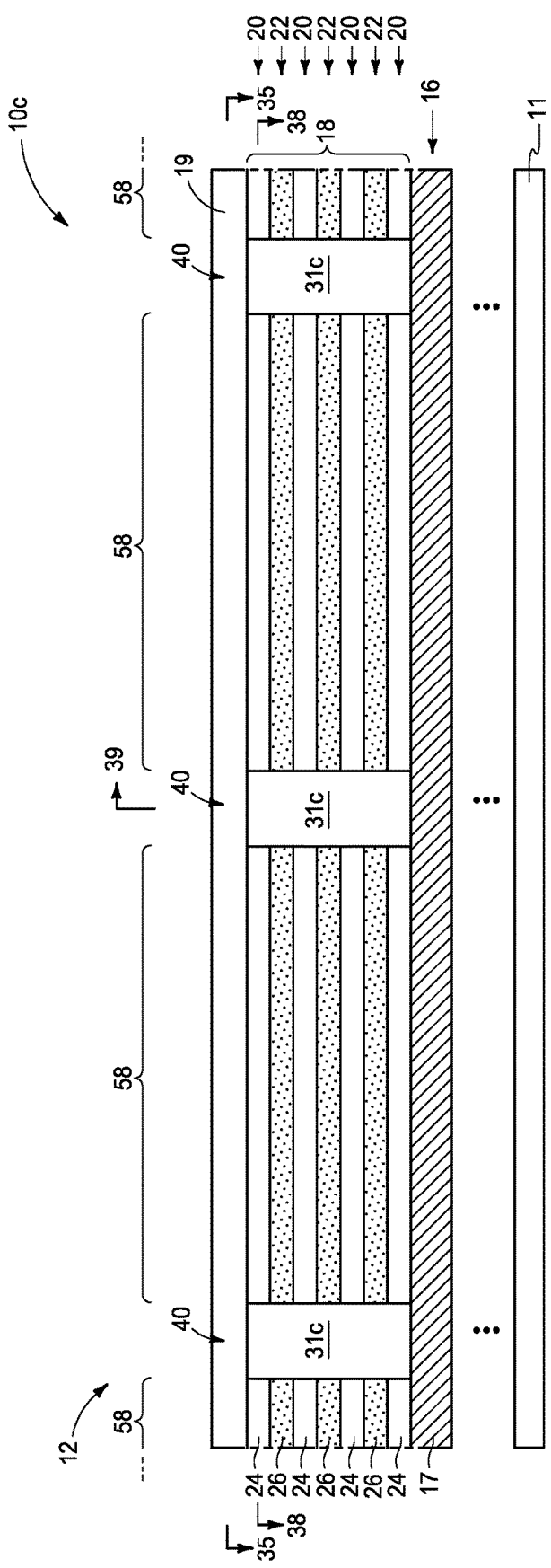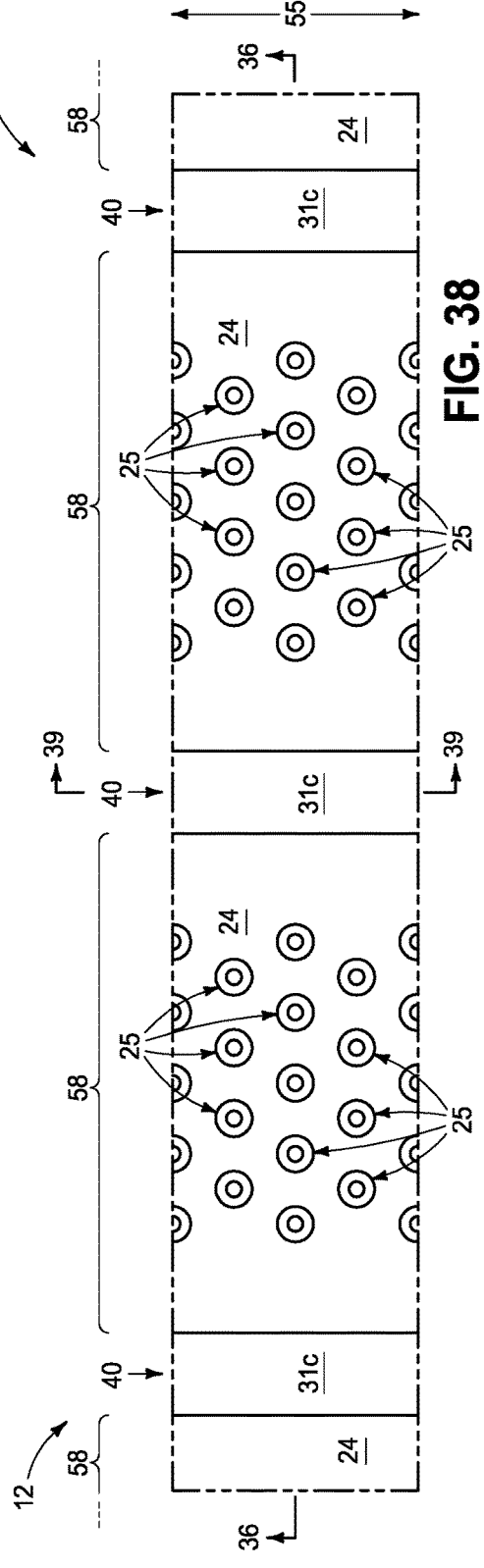

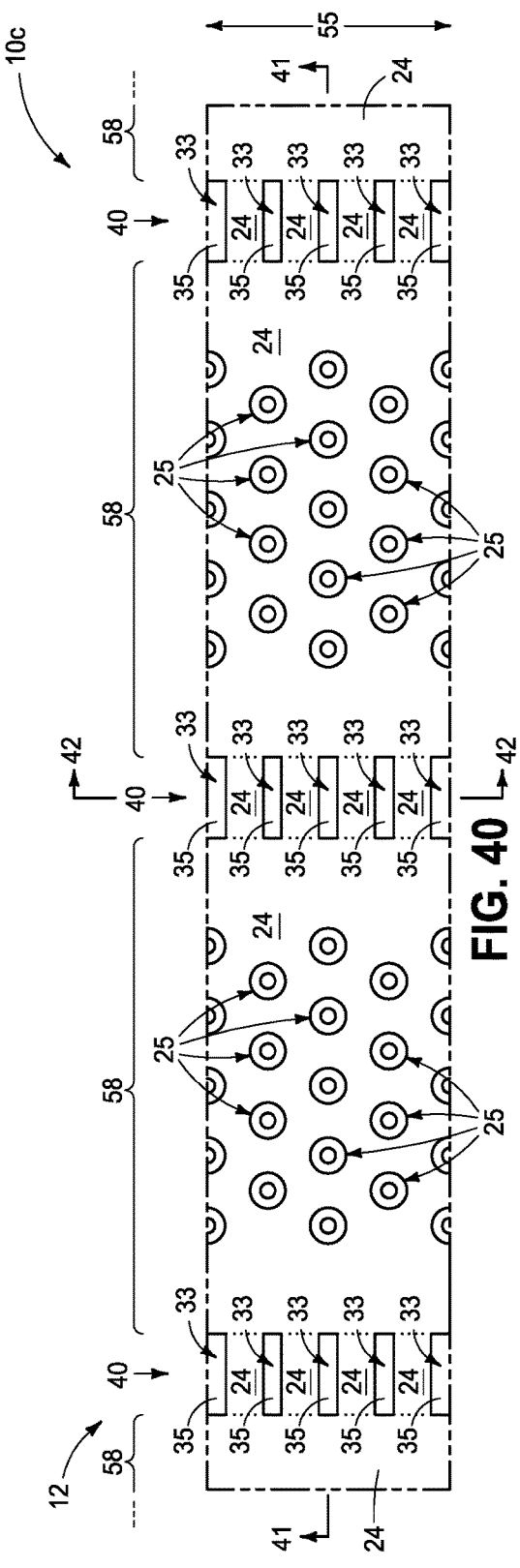
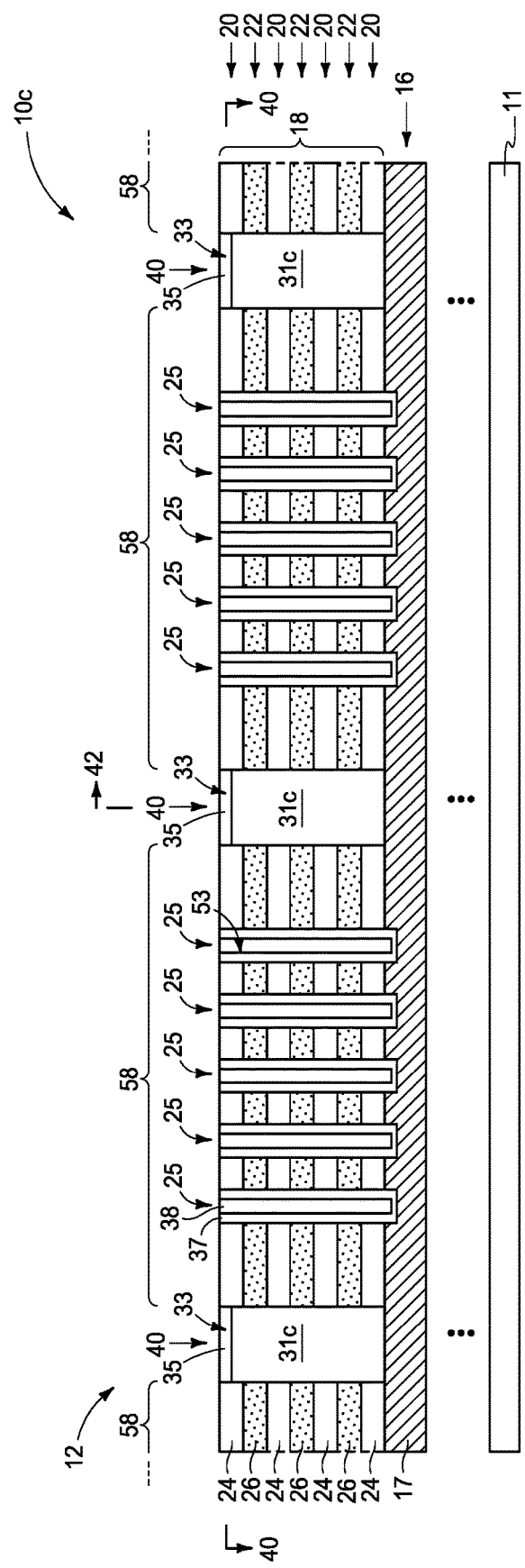
FIG. 40
FIG. 41

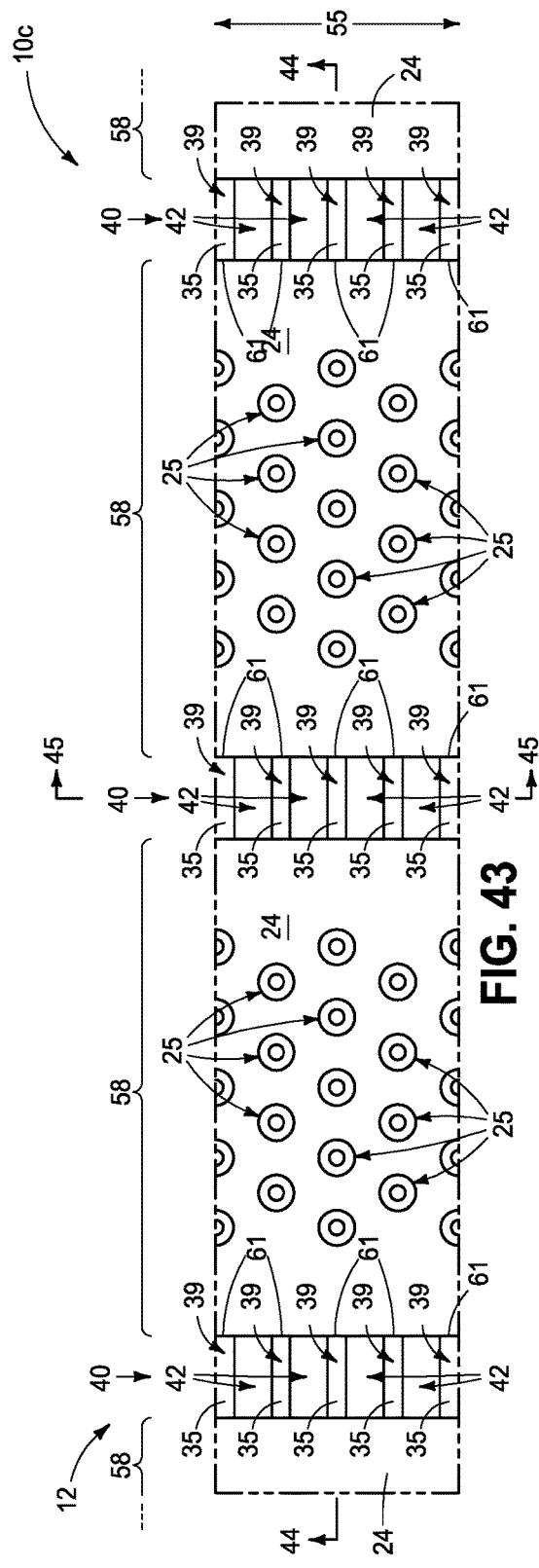
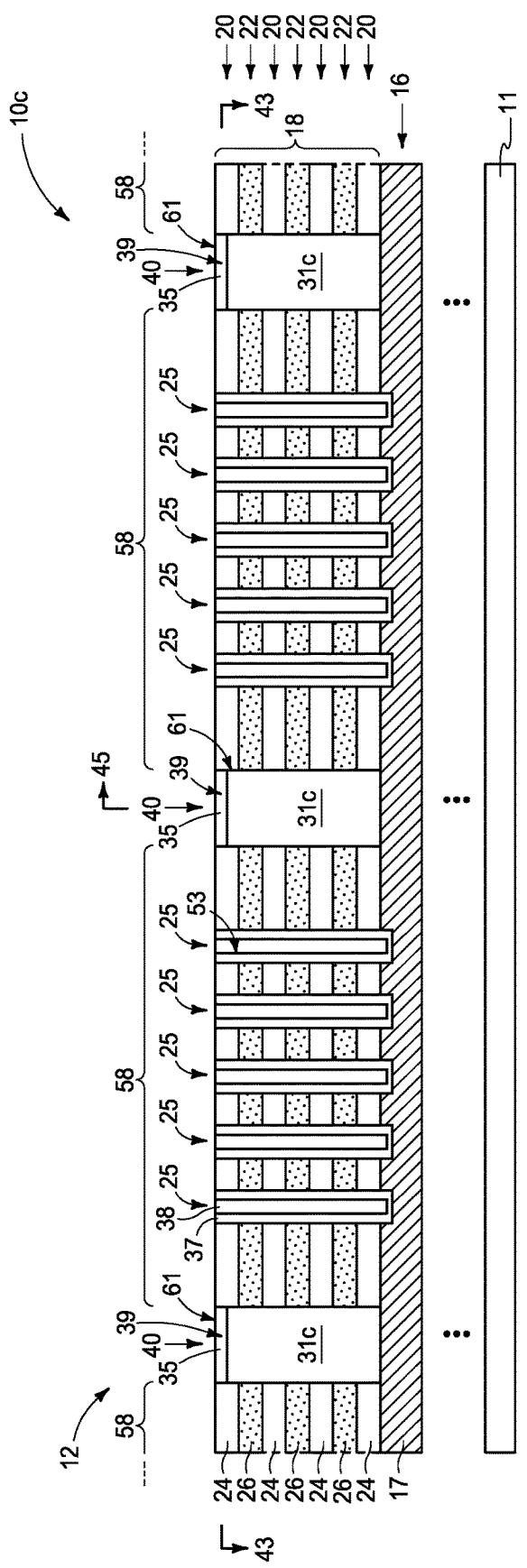
FIG. 43
FIG. 44

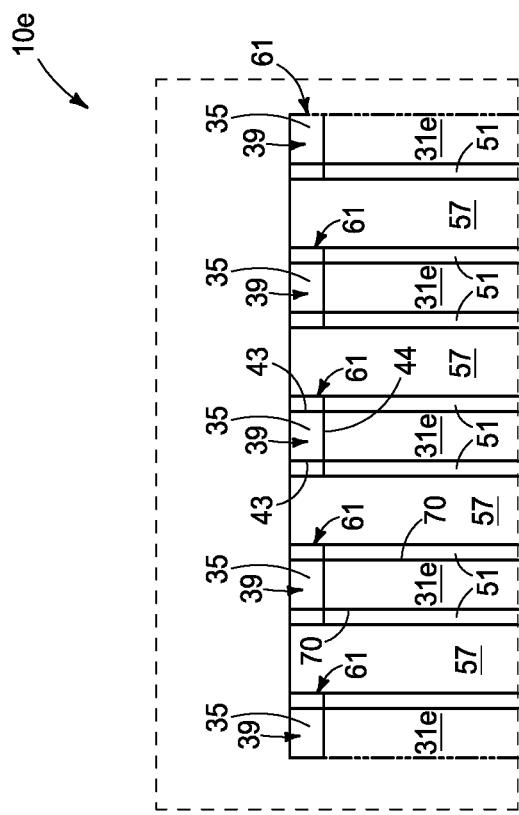
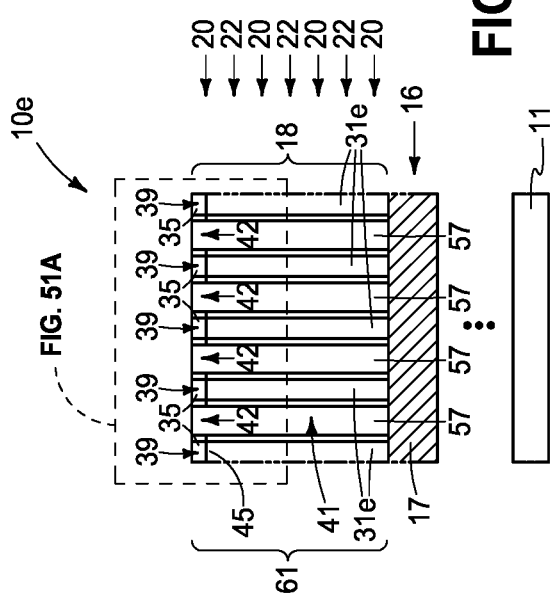

MEMORY ARRAYS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-27 are diagrammatic sequential sectional and/or enlarged views of the construction of FIGS. 1 and 2, or portions thereof, in process in accordance with some embodiments of the invention.

FIGS. 28-51 show alternate example method and/or structural embodiments of the invention.

DETAILED DESCRIPTION OF EXAMPLE EMBODIMENTS

Figure 4A:
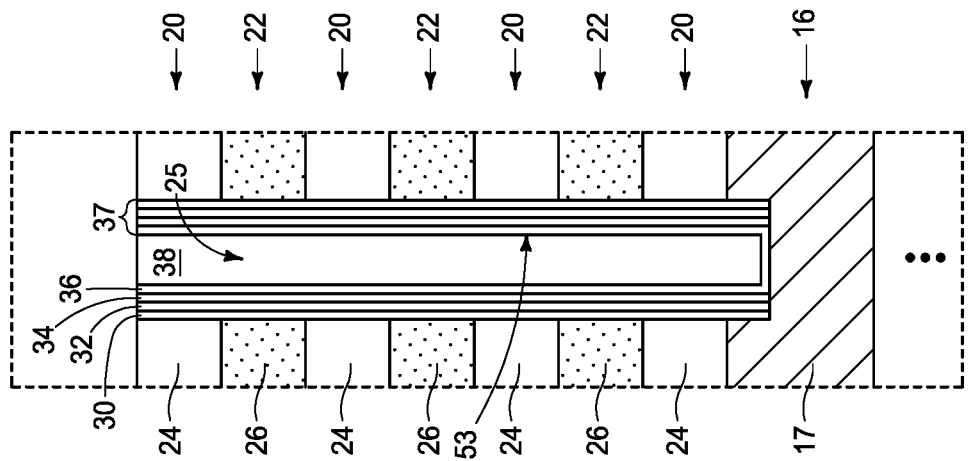
Figure 3A:
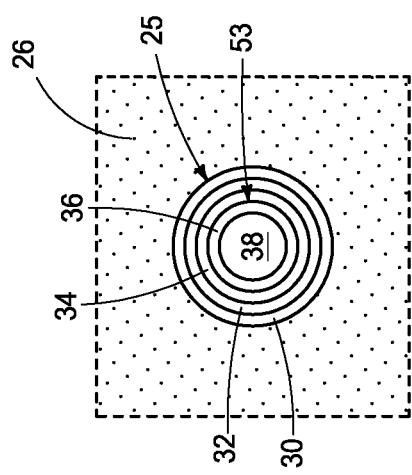
Figure 7:
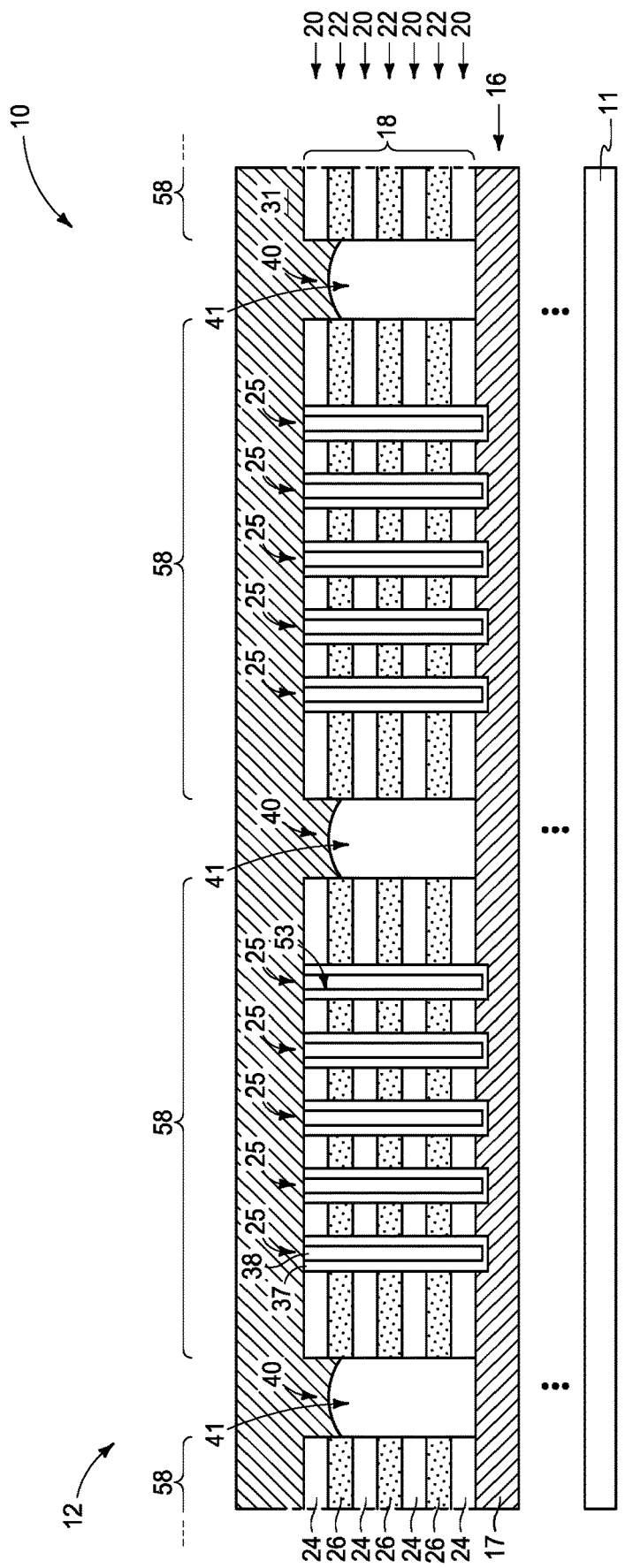
Figure 12:
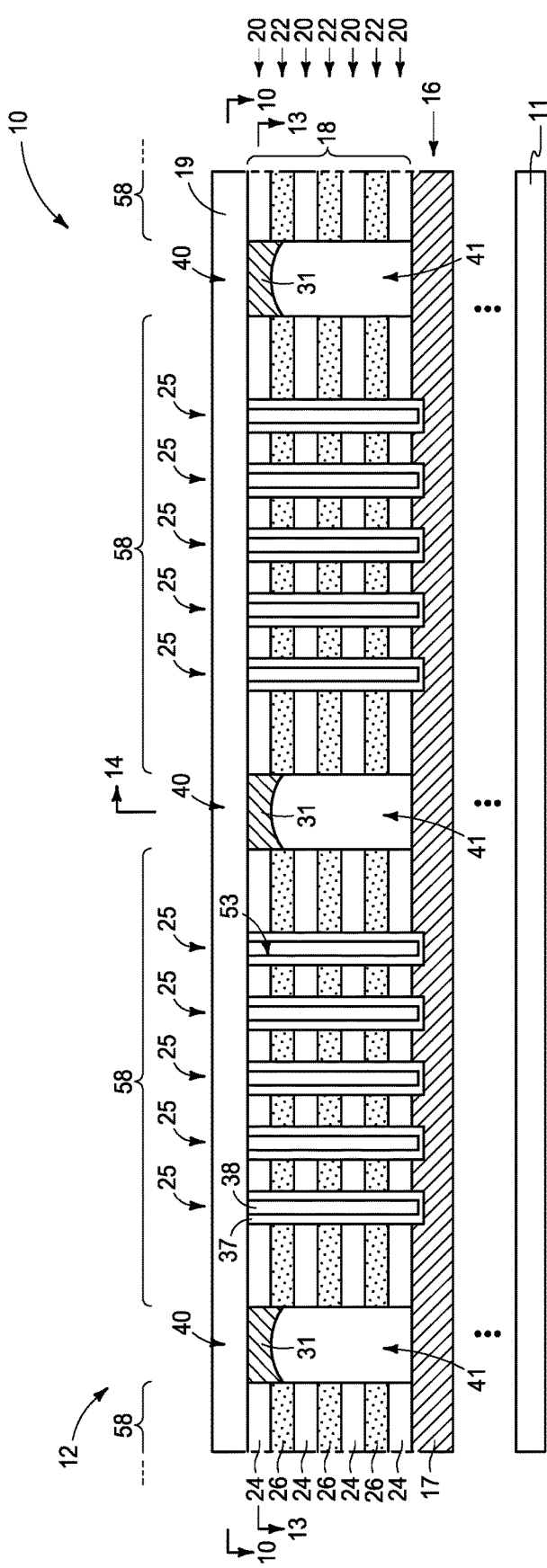
Figure 13:
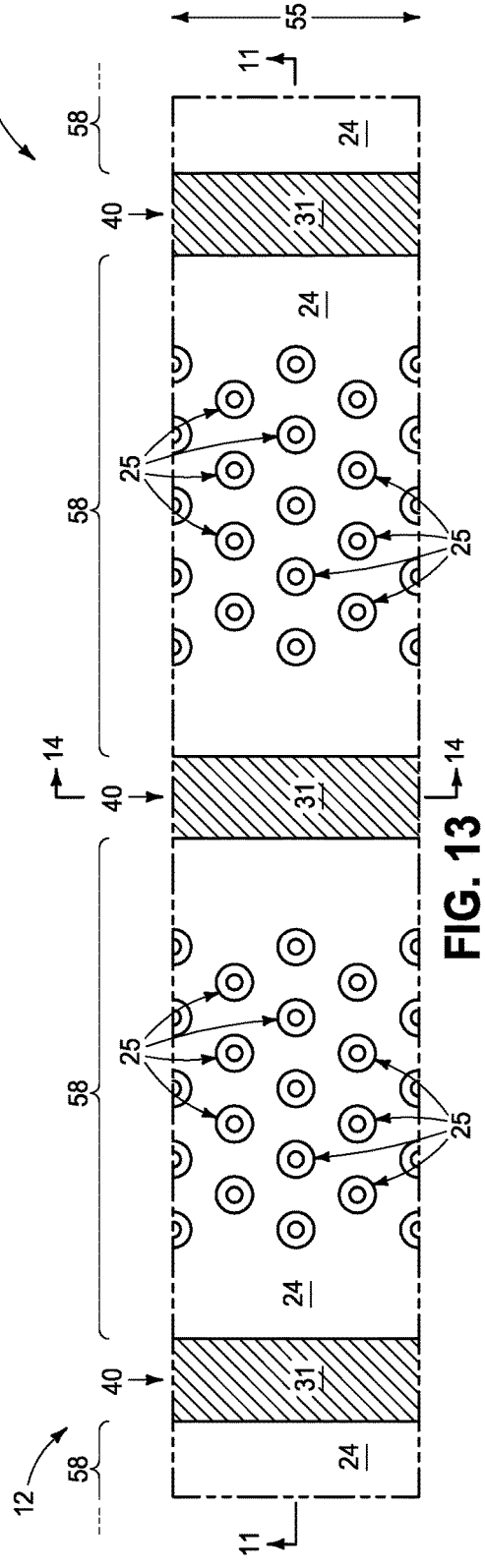
Figure 14:
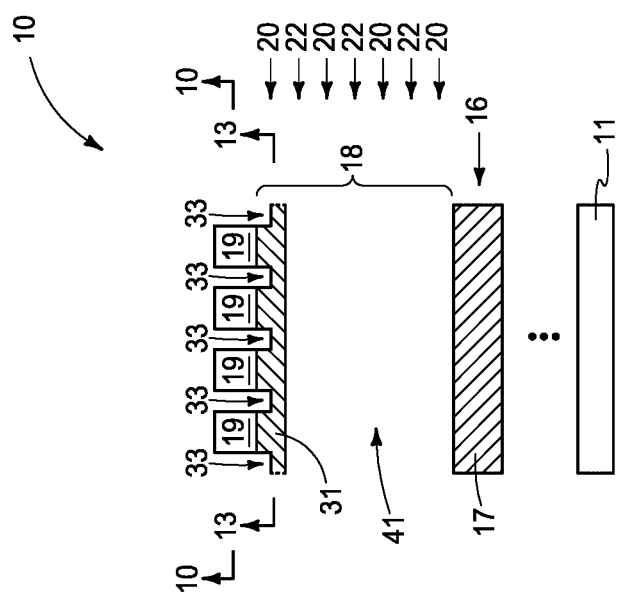

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-27 which may be considered as a "gate-last" or "replacement-gate" process.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Channel openings 25 have been formed (e.g., by etching) through insulative tiers 20 and conductive tiers 22 to conductor tier 16. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3, 3A, 4 and 4A show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride), Alternately, and by way of example only, the radially-central portion within channel openings 25 may include void space(s) (not shown) and/or be devoid of solid material (not shown). Conductive plugs (not shown) may be formed atop channel material strings 53 for better conductive connection to overlying circuitry (not shown).

Referring to FIGS. 5 and 6, horizontally-elongated trenches 40 have been formed (e.g., by anisotropic etching) into stack 18 to form laterally-spaced memory-block regions 58. Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown).

The above processing shows forming and filling channel openings 25 prior to forming trenches 40. Such could be reversed. Alternately, trenches 40 could be formed in between the forming and filling of channel openings 25 (not ideal).

In one embodiment, upper masses (e.g., bridges) will be formed across and along horizontally-elongated trenches 40 to be laterally-between and longitudinally-spaced-along immediately-laterally-adjacent memory-block regions 58. Void space will be below the upper masses in trenches 40 between laterally-spaced memory-block regions 58. One example method of forming such upper masses and void space is described starting with FIG. 7. Such shows forming a lower material 31 in trenches 40 which, in one embodiment and as shown, bridges across trenches 40 as opposed to filling such trenches and thereby leaving void space 41 there-below. Lower material 31 may be wholly or partially sacrificial. Ideally, lower material 31 is of a composition that can be removed (e.g., by isotropic etching) selectively relative to stack materials 24, 26, and material 17 there-below. Example materials include elemental metals (e.g., W, Co, etc.), metal compounds, polysilicon, semi-metal oxides, and insulative metal oxides or other insulative material(s). The artisan is able to select suitable physical and/or chemical vapor deposition methods and lower material 31 by which a lower material 31 may be deposited to bridge across trenches 40 to leave void space 41 there-below.

Referring to FIGS. 8 and 9, lower material 31 has been planarized back (e.g., by chemical mechanical polishing) at least to a top surface of uppermost insulative tier 20.

Referring to FIGS. 10-14, a mask comprising example mask lines 19 has been formed atop uppermost insulative tier 20, followed by vertically-recessing longitudinally-spaced regions of lower material 31 between mask lines 19 to form vertical recesses 33.

Figure 17:
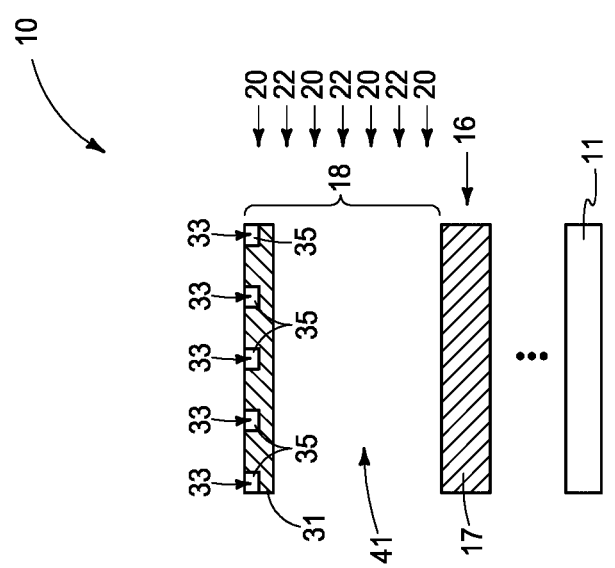

Referring to FIGS. 15-17, vertical recesses 33 have been filled with upper material 35 that is of different composition from that of lower material 31. In some embodiments, upper material 35 may be considered as first material 35 (as may material 31h referred to below). Example materials 35 include those described for lower material 31 as long as materials 31 and 35 are not wholly of the same composition. In but one specific example, lower material 31 is elemental tungsten and upper material 35 is polysilicon. An example technique for fabricating the structure of FIGS. 15-17 from that of FIGS. 10-14 includes deposition of upper material 35 sufficient to over-fill vertical recesses 33, followed by planarizing upper material 35 back at least to a top surface of uppermost insulative tier 20. Mask lines 19 (not shown) may be removed before or after deposition of upper material 35, including, as an example, by a single chemical mechanical polishing step that removes both mask lines 19 (not shown) and upper material 35 back at least to uppermost tier 20.

Figure 20:
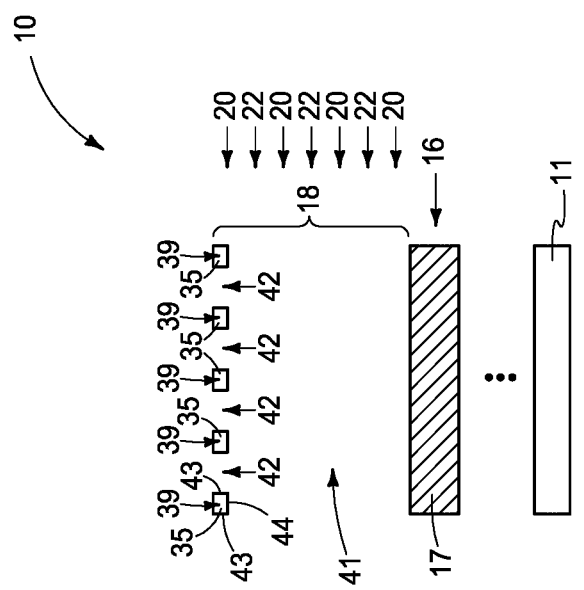

Referring to FIGS. 18-20, lower material 31 (not shown) has been removed selectively (e.g., by wet or dry isotropic etching) relative to upper material 35 (and ideally selectively relative to materials 17, 24, and 26) to leave upper material 35. Upper material 35 thereby comprises upper masses 39 (e.g., bridges) that have been formed across and along trenches 40 to be laterally-between and longitudinally-spaced-along adjacent memory-block regions 58. Void space 41 is below upper masses 39 in trenches 40 between memory-block regions 58. Spaces 42 are longitudinally-between upper masses 39. Upper masses 39 may be considered as having first-material longitudinal sidewalls 43 and first-material bottoms 44.

Figure 21:
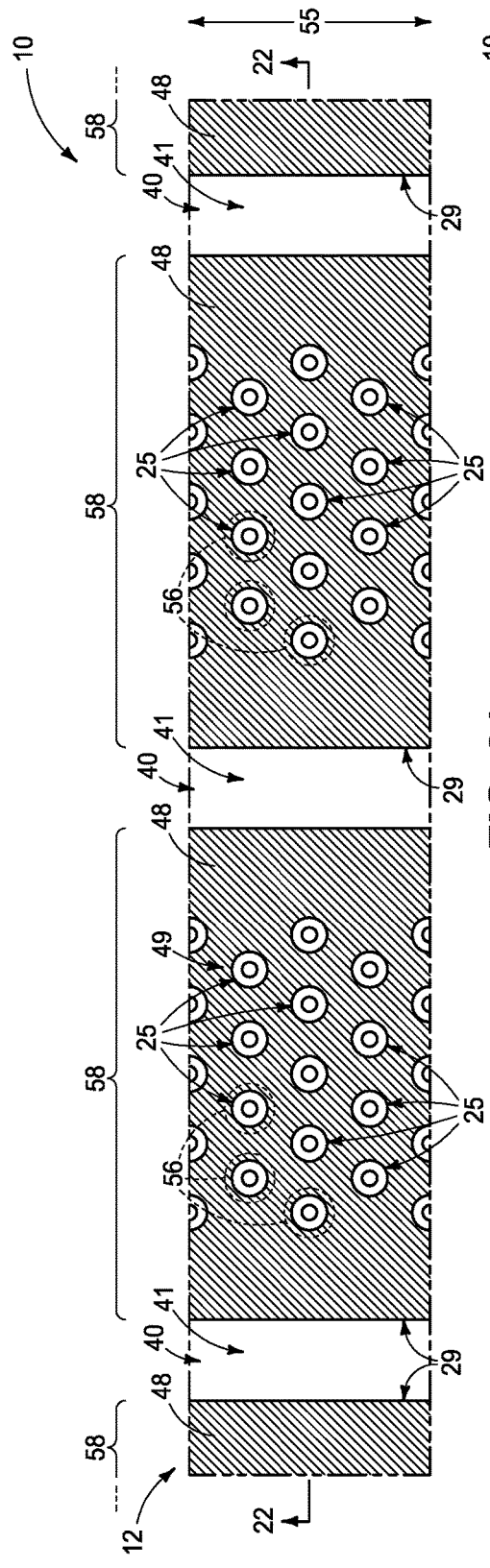
Figure 22:
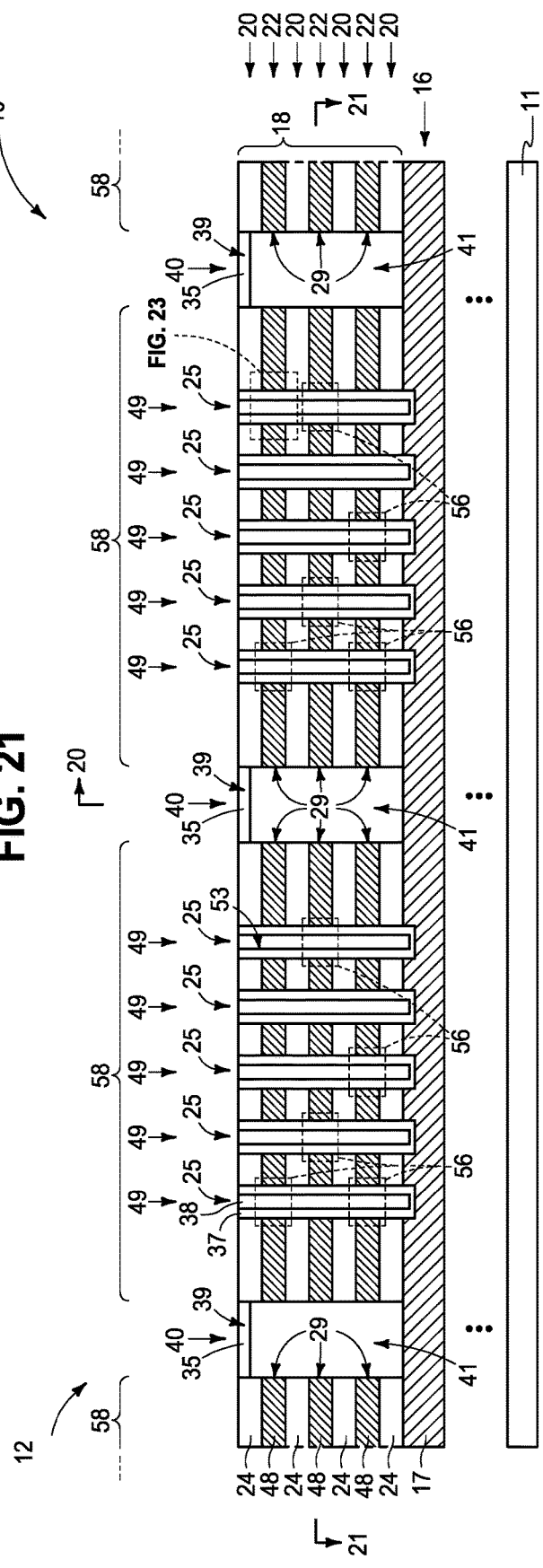
Figure 23:
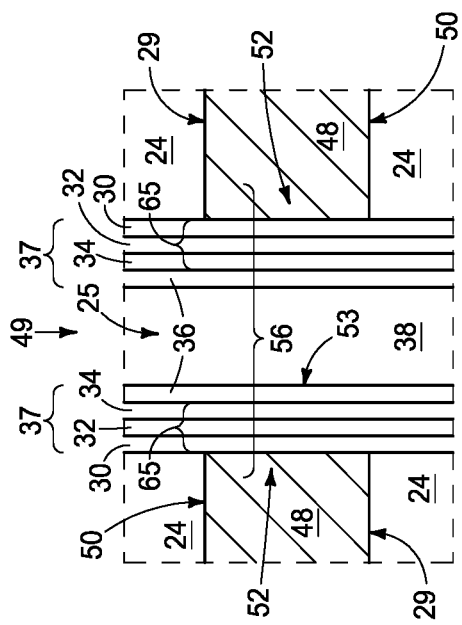
Figure 24:
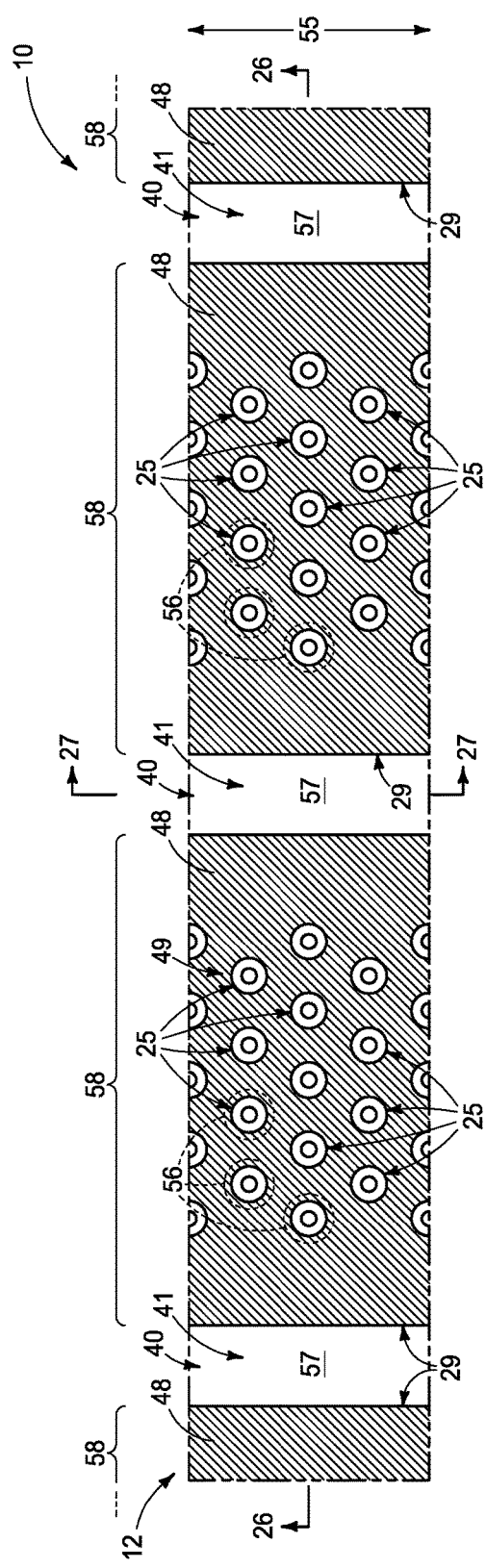
Figure 25:
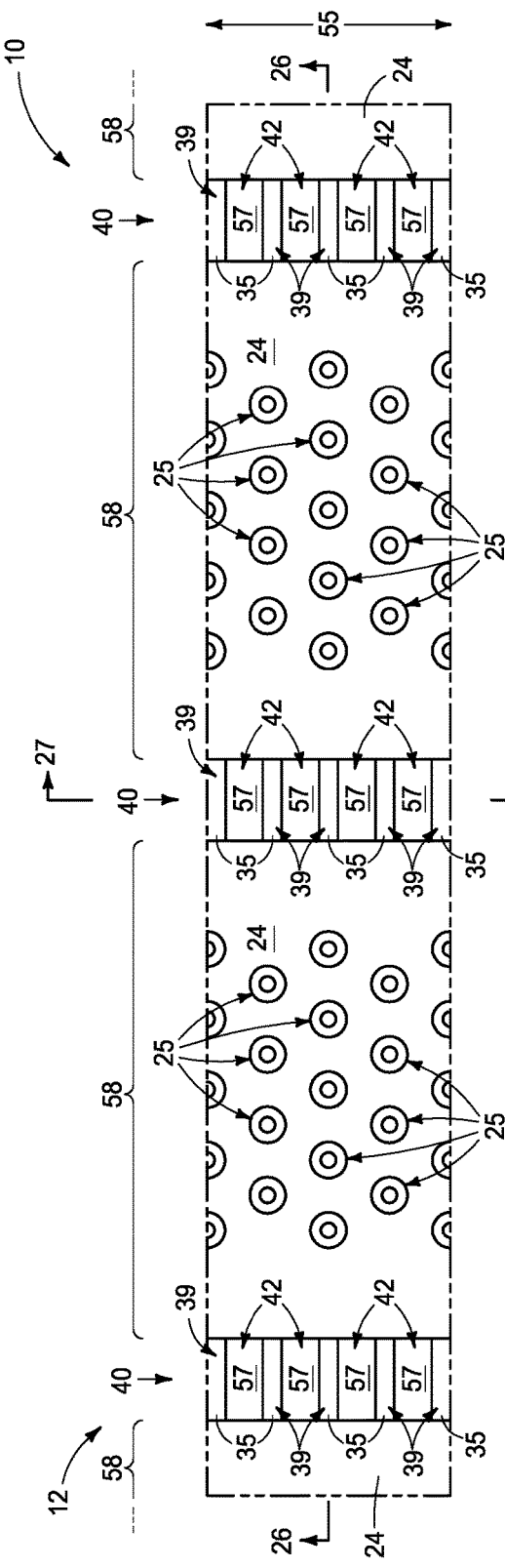

Referring to FIGS. 21-23, and in one embodiment, material 26 (not shown) of conductive tiers 22 has been removed, for example by being isotropically etched away through spaces 42 and void spaces 41 ideally selectively relative to the other exposed materials (e.g., using liquid or vapor $H_3PO_4$ as a primary etchant where material 26 is silicon nitride, and other materials comprise one or more oxides or polysilicon). Material 26 in conductive tiers 22 in the example embodiment is sacrificial and has been replaced with conducting material 48, and which has thereafter been removed from spaces 42 and void spaces 41 in trenches 40, thus forming individual conductive lines 29 (e.g., wordlines) and elevationally-extending strings 49 of individual transistors and/or memory cells 56. A thin insulative liner (e.g., $Al_2O_3$ and not shown) may be formed before forming conducting material 48. Approximate locations of transistors and/or memory cells 56 are indicated with a bracket in FIG. 23 and some with dashed outlines in FIGS. 21 and 22, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 23) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming upper masses 39. Alternately, the conducting material of the conductive tiers may be formed before forming upper masses 39 and/or before forming trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30.

By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Referring to FIGS. 24-27, and in one embodiment, void spaces 41 have been filled with material 57, as have spaces 42. In one embodiment, material 57 is insulative (e.g., $SiO_2$, $Si_3N_4$, $Al_2O_3$, undoped polysilicon, a combination of $SiO_2$ and undoped polysilicon, etc.). Material 57 may be of the same composition as that of first/upper material 35 or may be of a different composition from that of first/upper material 35.

Figure 28:
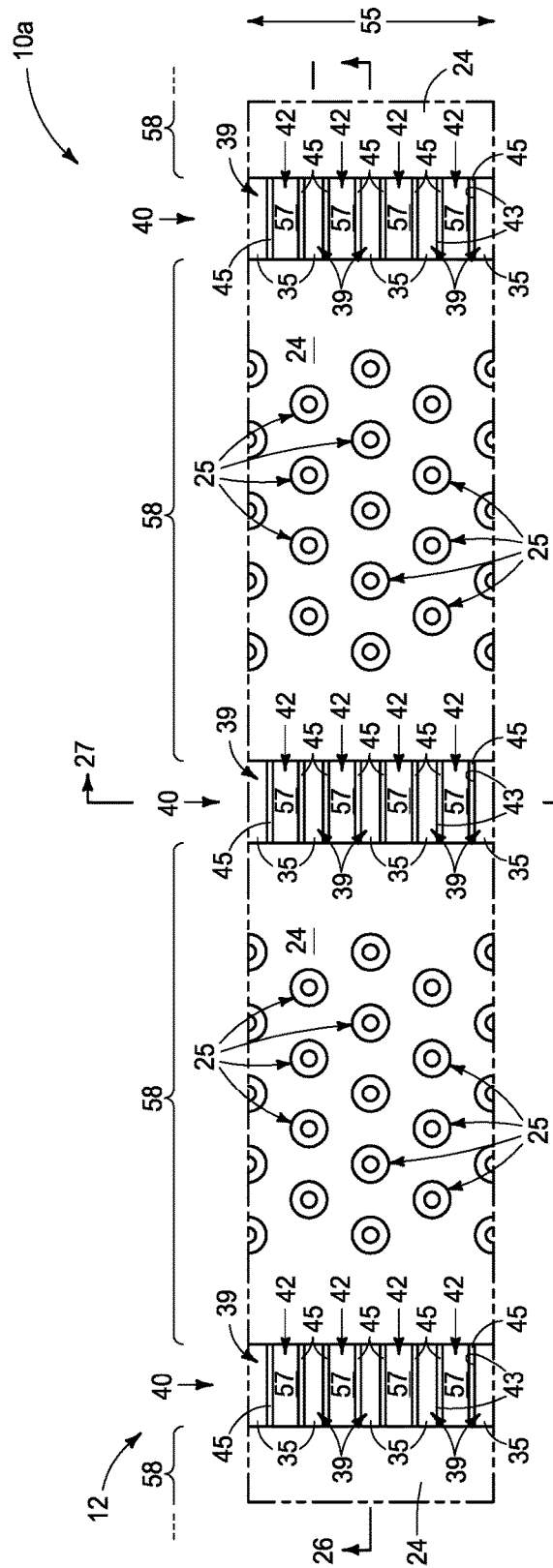
Figure 29A:
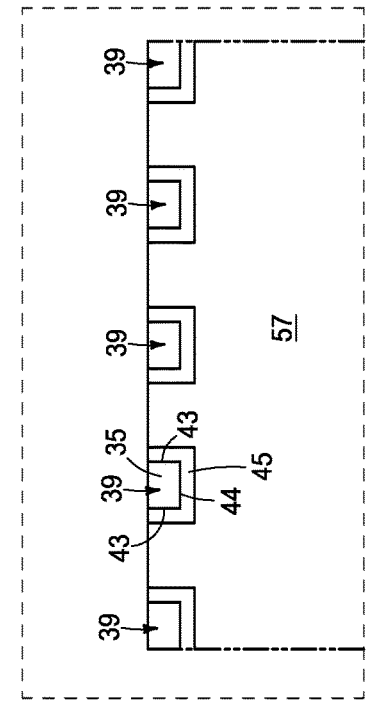
Figure 29:
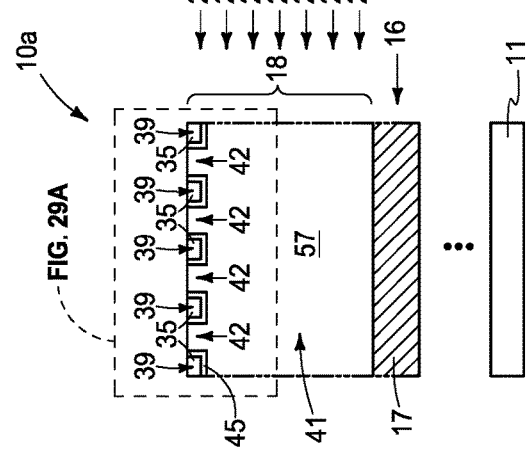

Processing as described above may result in an alternate example construction 10a as shown in FIGS. 28, 29, and 29A. Like numerals from the above-described embodiments have been used where appropriate, with some construction differences being indicated with the suffix "a" or with different numerals. FIGS. 28 and 29 correspond to the vertical cross-sections of FIGS. 25 and 27, respectively. In FIGS. 28, 29, and 29A, an oxide-comprising material 45 has been formed against, in one embodiment directly against, first-material longitudinal sidewalls 43 of upper masses 39, with oxide-comprising material 45 being of different composition from that of first material 35. In some embodiments, oxide-comprising material 45 may be considered as first oxide-comprising material 45. In one embodiment and as shown, oxide-comprising material 45 has also been formed against, and in one embodiment directly against, first-material bottoms 44 of upper masses 39. Oxide-comprising material 45 may be formed as a native oxide the result of oxidation of first/upper material 35 occurring between the processing shown by FIGS. 18-23 and FIGS. 24-27 (e.g., by exposure of construction 10a to room-ambient air and/or other oxygen-containing ambient or that may be otherwise formed/deposited). In one embodiment and as shown, oxide-comprising material 45 over one or both of first-material longitudinal sidewalls 43 or first-material bottoms 44 is a continuous layer. Alternately, such may be a discontinuous layer (e.g., having one or more void spaces and/or edge-to-edge breaks there-through, and not shown) over one or both of first-material longitudinal sidewalls 43 or first-material bottoms 44. Any other attribute(s) or aspect(s) as shown and/or described herein with respect to other embodiments may be used.

Figure 30:
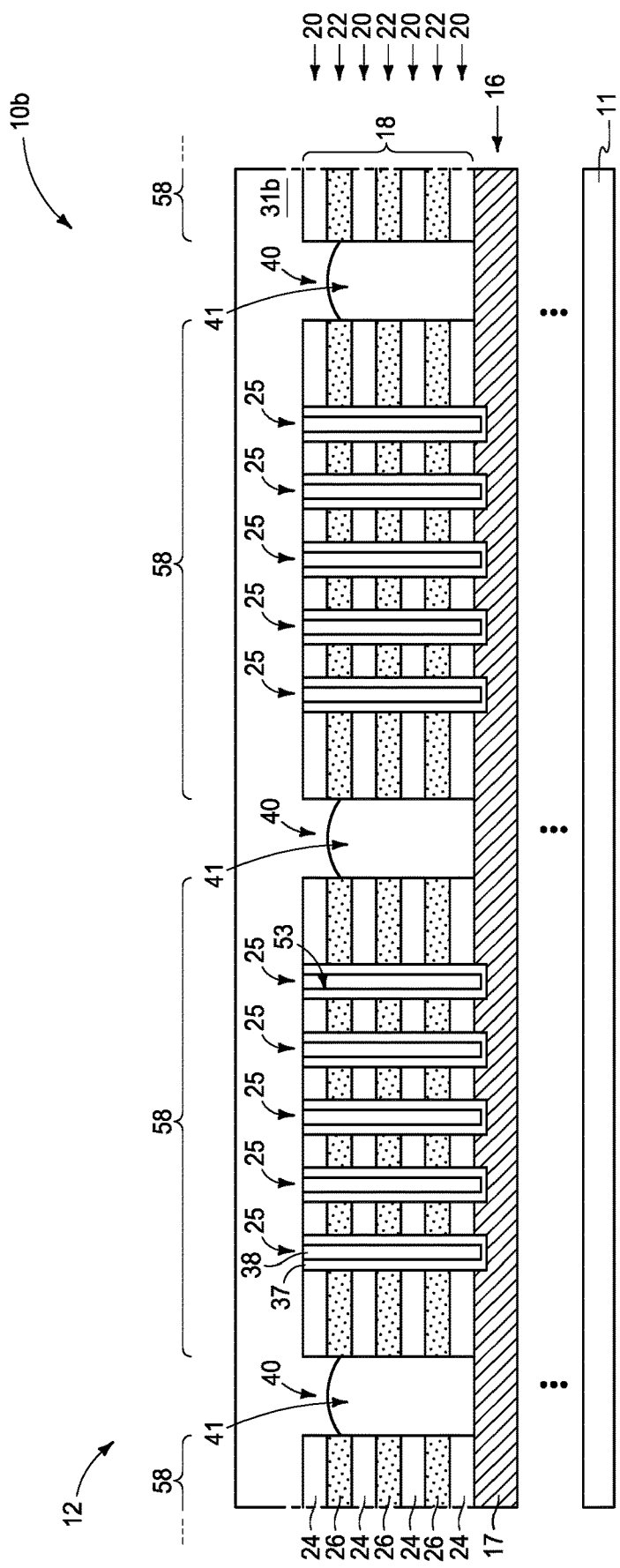
Figure 31:
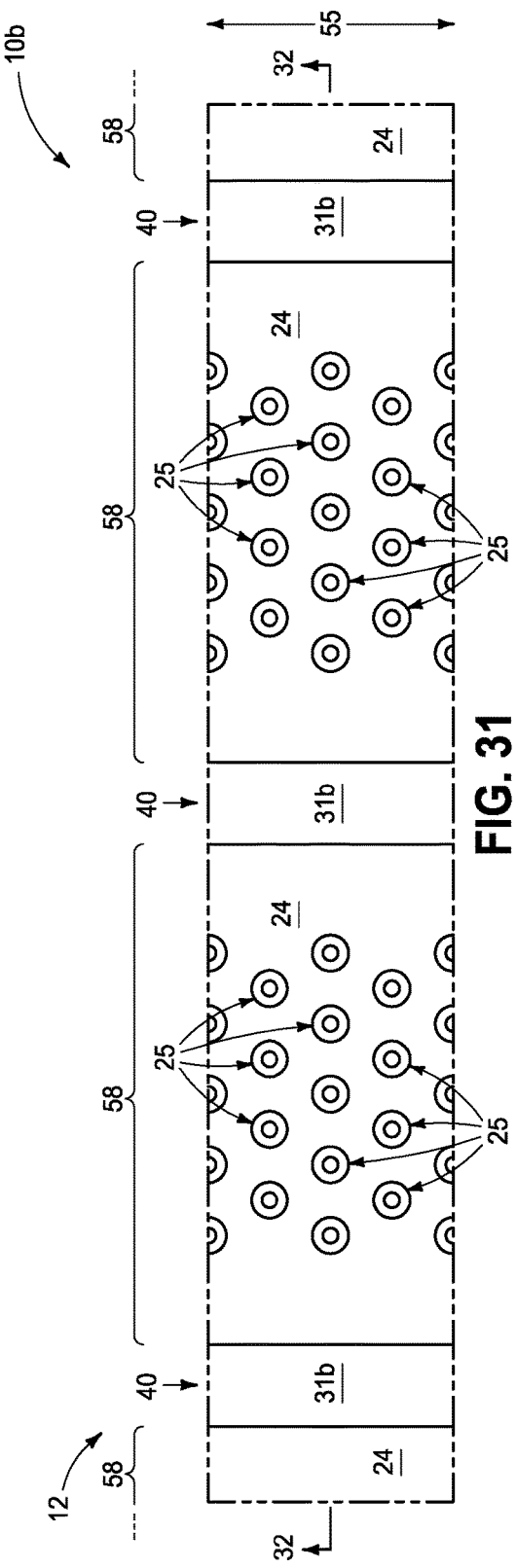
Figure 32:
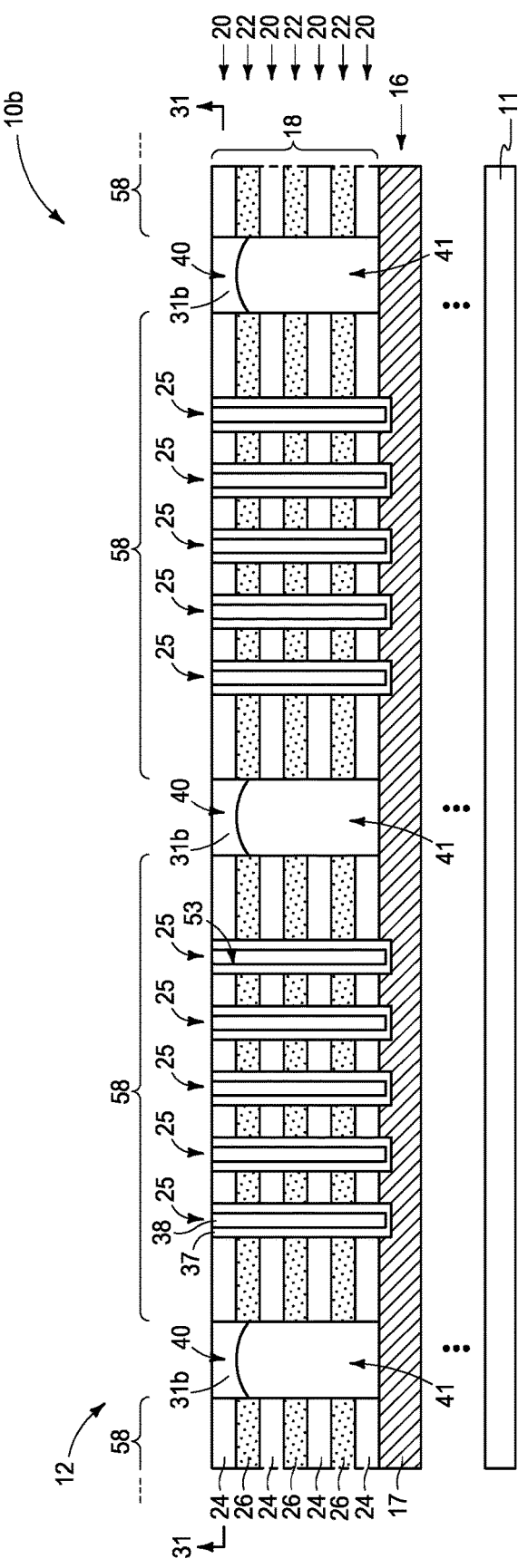
Figure 33:
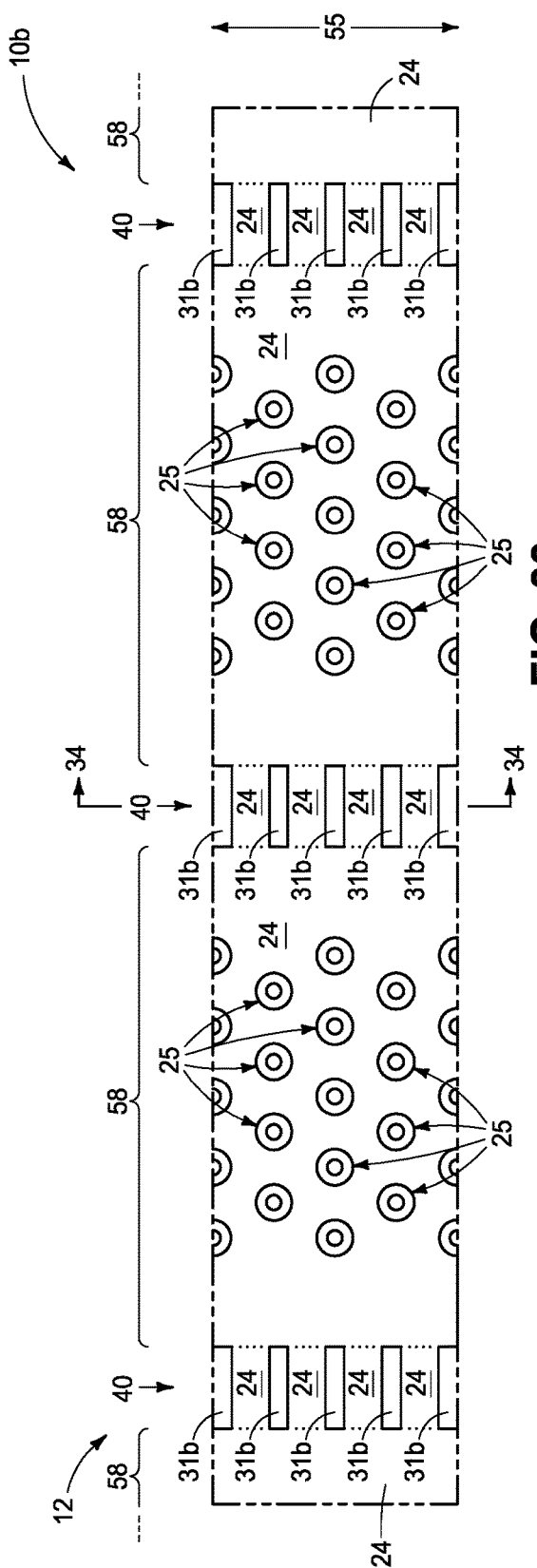
Figure 34:
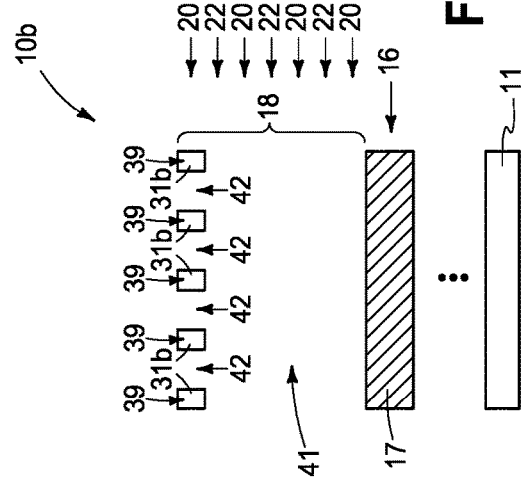
Figure 35:
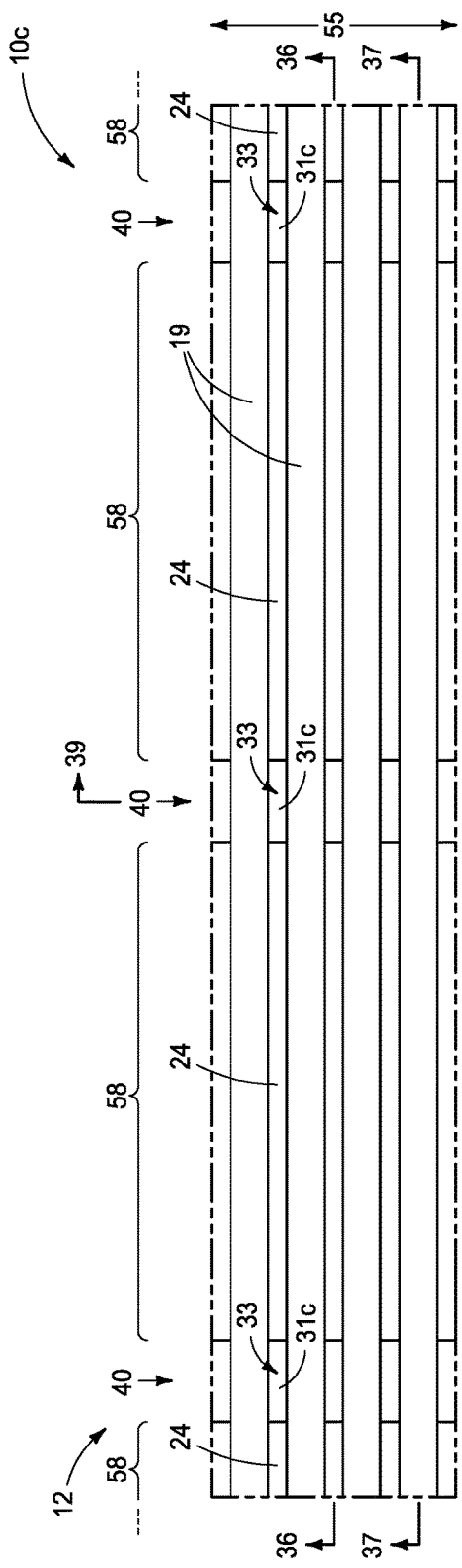
Figure 36:
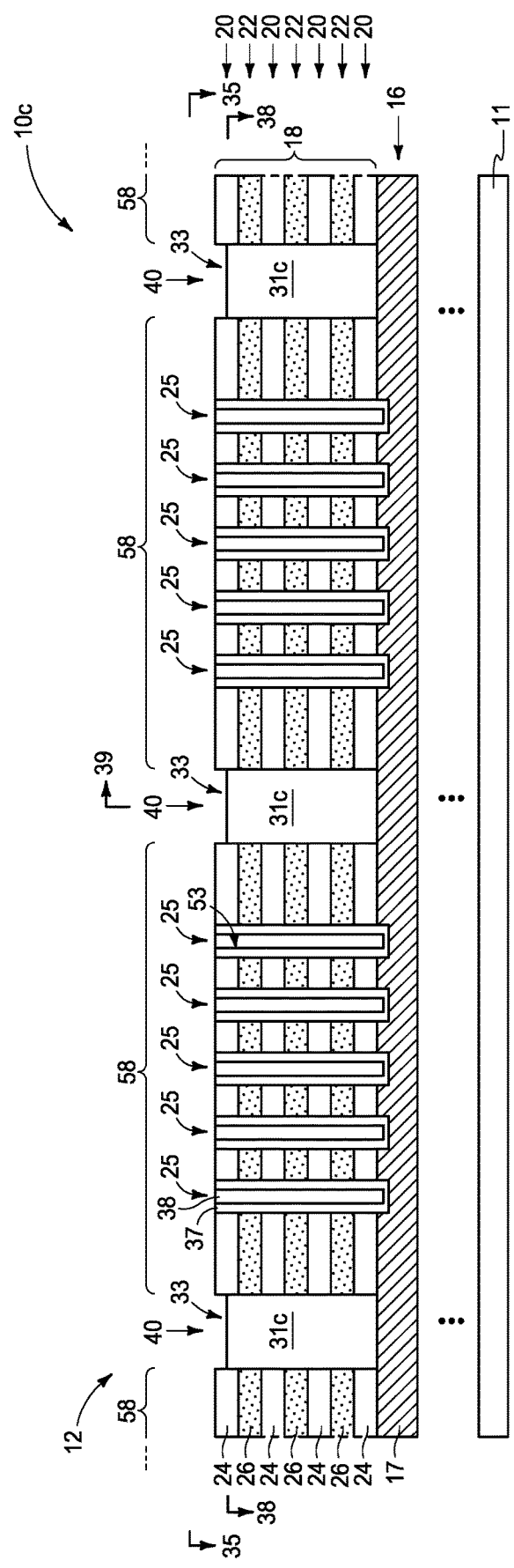
Figure 39:
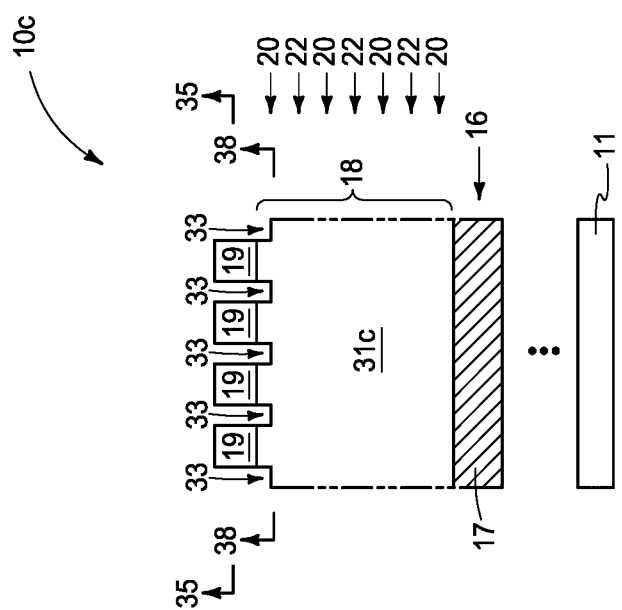

The above example described techniques are but example methods of forming upper masses 39, and with such examples using both a lower material 31 and an upper material 35, forming vertical recesses 33, etc. Any alternate existing or future-developed methods may be used. For example, and by way of example only, the upper masses may be formed using only a single first material 31b as shown in processing described with reference to FIGS. 30-34 with respect to a construction 10b. Like numerals from the above-described embodiments have been used where appropriate, with some construction differences being indicated with the suffix "b". FIG. 30 shows formation of a first material 31b analogous to that shown by FIG. 7, which has been followed by planarizing such back (FIGS. 31 and 32) at least to a top surface of uppermost insulative tier 20 analogous to that shown by FIGS. 8 and 9. Processing could proceed subsequently as shown in FIGS. 33 and 34 without forming vertical recesses 33 (not shown) and filling such with a different composition upper material 35 (not shown). Regardless, an oxide 45 (not shown) may be formed as in the example embodiments described above with respect to FIGS. 28, 29, 29A. Subsequent processing as described above, or otherwise, may occur.

Processing as described with respect to FIGS. 1-23 in the first example embodiments may be preferred (although not required) due to desired composition of first material 35 in the finished construction. For example, and by way of example only, consider that a desired first material 35 in the finished construction as being undoped-polysilicon and that it may be difficult to deposit such in a non-conformal manner to bridge over and not otherwise fill or line trenches 40. Consider that some other material (e.g., elemental tungsten) is easier than polysilicon to deposit so that it bridges over trenches 40 as shown (e.g., by physical vapor deposition), and that such other material is highly selectively wet-isotropically-etchable in comparison to polysilicon (as is elemental tungsten). In such events, processing(s) as shown by FIGS. 1-23 may be more desirable than that shown by FIGS. 30-34.

An alternate example method used in forming a memory array comprising strings of memory cells is described with reference to FIGS. 35-47 with respect to a construction 10c. Like numerals from the above-described embodiments have been used where appropriate, with some construction differences being indicated with the suffix "c" or with different numerals. FIGS. 35-39 show processing analogous to that shown through FIGS. 10-14, but where lower (second) material 31c has been deposited to, in one embodiment, completely fill trenches 40, followed by forming vertical recesses 33 therein.

Figure 42:
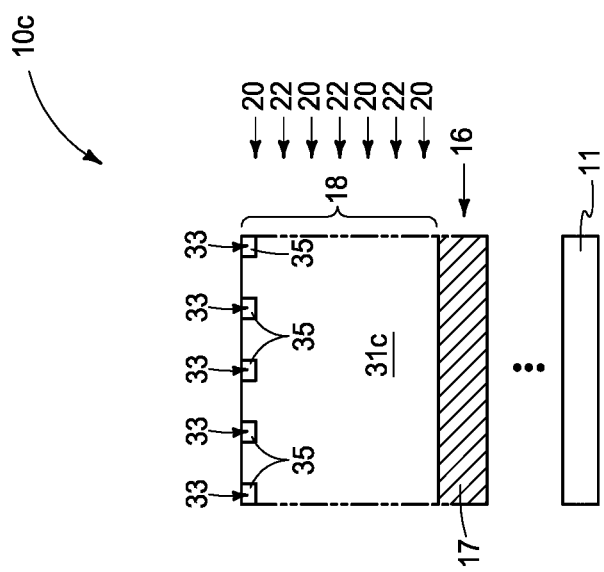

FIGS. 40-42 show example subsequent processing wherein vertical recesses 33 have been filled with upper material 35 and mask lines 19 (not shown) have been removed.

Figure 45:
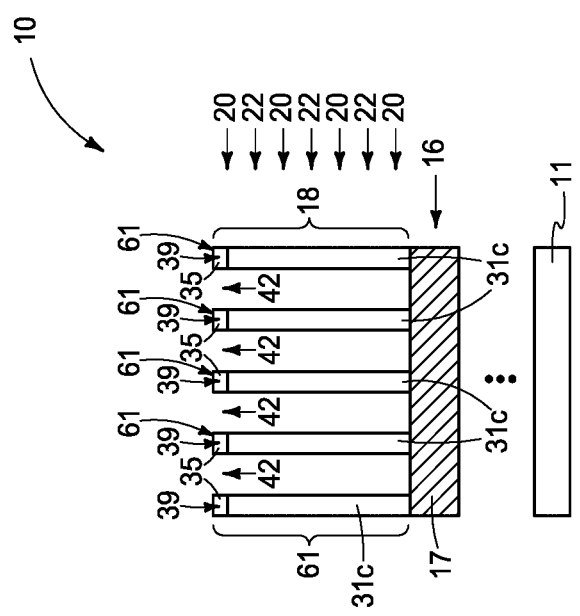

FIGS. 43-45 show upper material 35 and insulative material 24 having been used as a mask (ideally without forming and patterning other masking material(s) there-atop) while anisotropically etching lower/second material 31c within trenches 40 to conductive material 17. Such has thereby formed pillars 61 laterally-between and longitudinally-spaced-along immediately-laterally-adjacent memory blocks 58. Pillars 61 comprise an upper first material 35 and a lower/second material 31c below first material 35, with such first and second materials being of different compositions relative one another.

Figure 46:
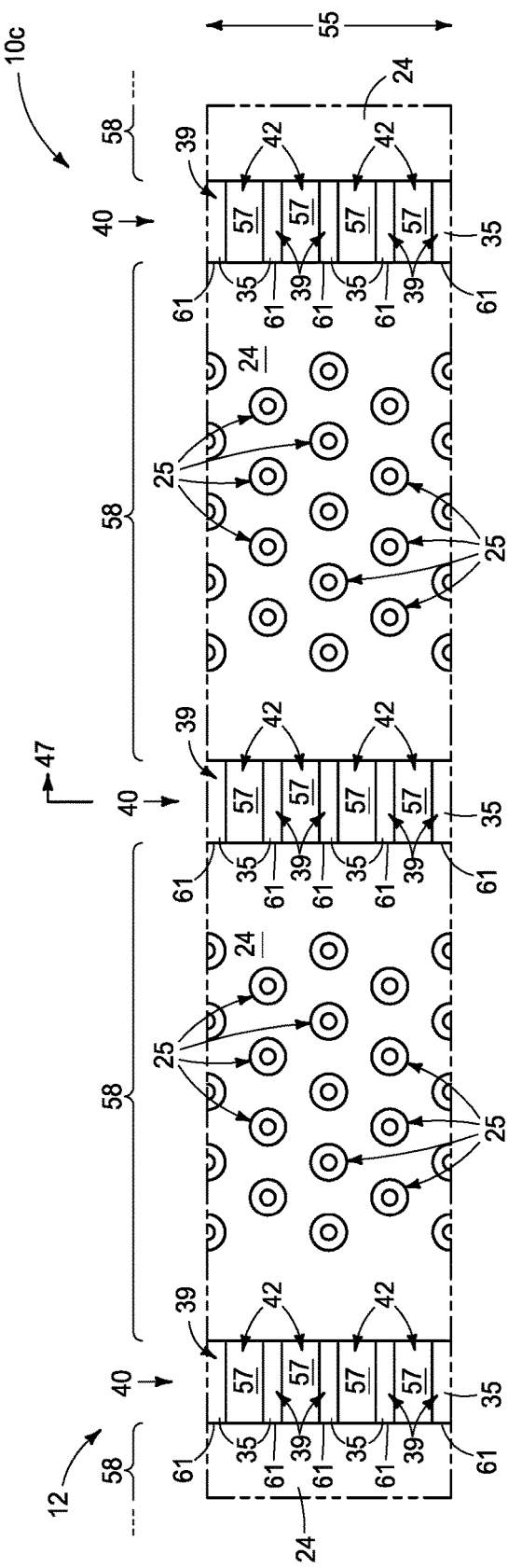
Figure 47:
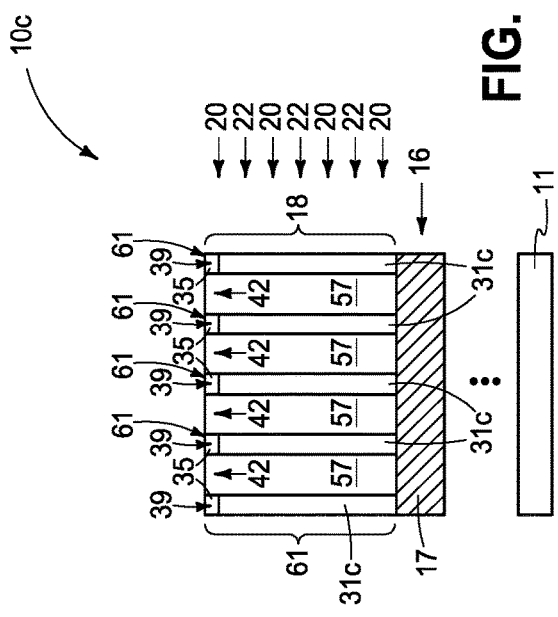

FIGS. 46 and 47 show example subsequent processing wherein void spaces in trenches 40 longitudinally between pillars 61 have been filled with an insulative material 57, which may be the same in composition as that of either lower/second material 31c or upper material 35, or be of different composition relative to each of such materials. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture.

Nevertheless, such memory arrays may have any of the attributes as described herein in method embodiments. Likewise, the above-described method embodiments may incorporate, form, and/or have any of the attributes described with respect to device embodiments.

Embodiments of the invention include a memory array (e.g., 12) comprising strings (e.g., 49) of memory cells (e.g., 56). The memory array comprises laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of memory cells extend through the insulative tiers and the conductive tiers. Upper masses (e.g., 39) comprising first material (e.g., 35) are laterally-between and longitudinally-spaced-along the immediately-laterally-adjacent memory blocks.

In one embodiment, at least some portion of the respective upper masses is within the vertical stack, in one such embodiment all of the respective upper masses are totally within the vertical stack, and in one such latter embodiment and as shown the respective upper masses comprise a top planar surface that is coplanar with a top planar surface of the vertical stack. Any other attribute(s) or aspect(s) as shown and/or described herein with respect to other embodiments may be used.

Figure 48:
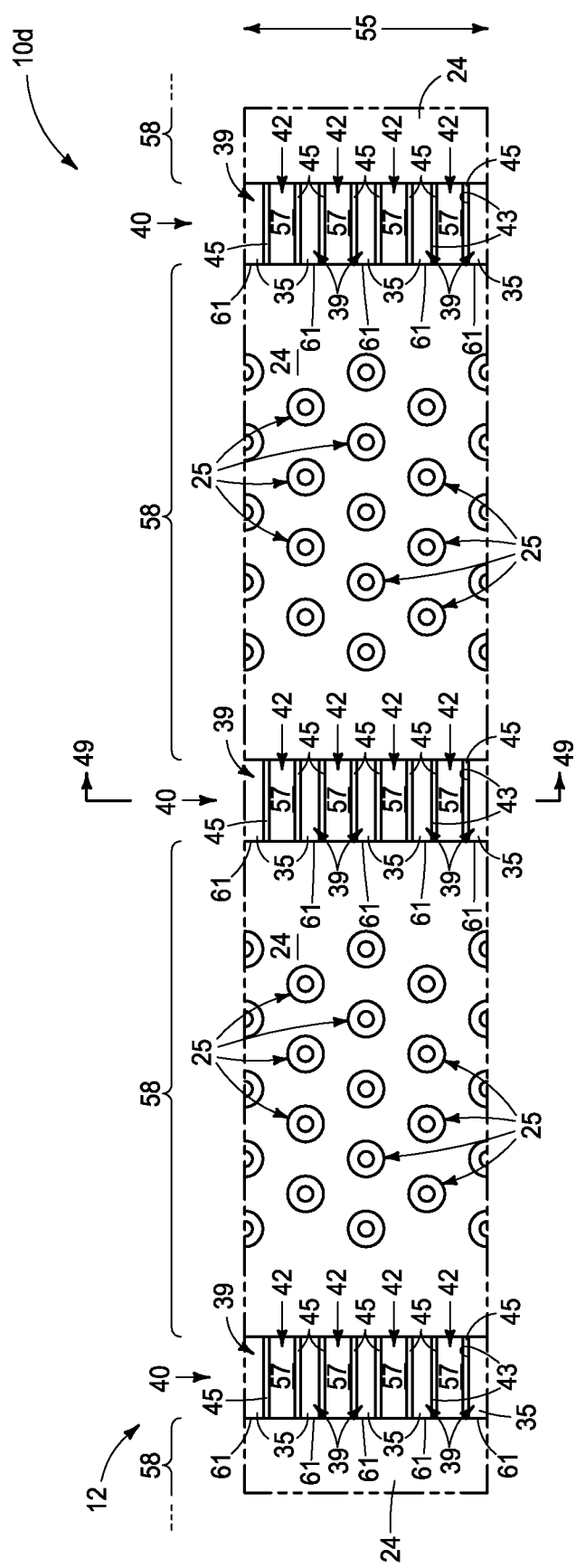
Figure 49A:
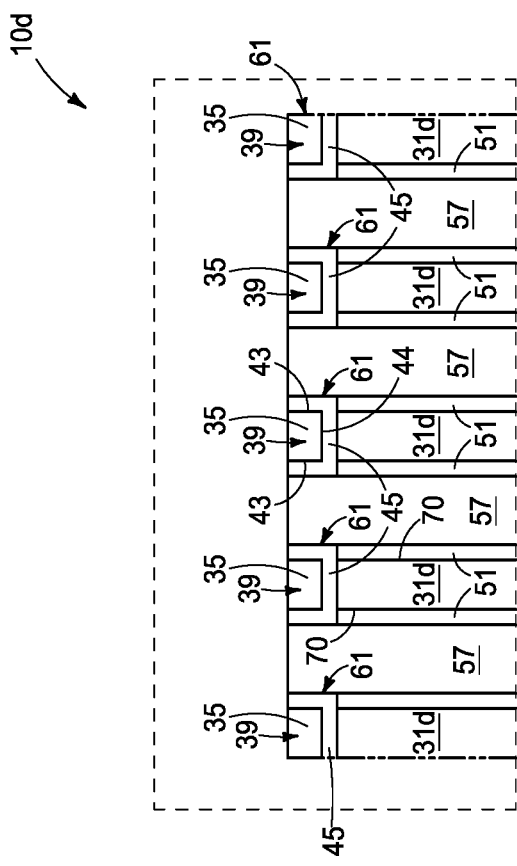
Figure 49:
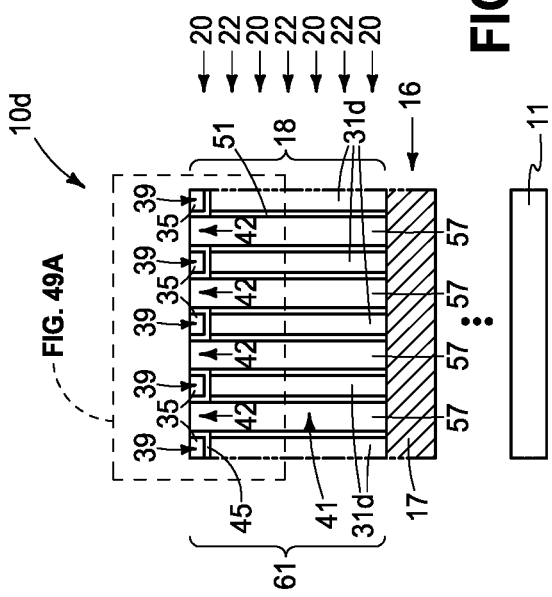

In one embodiment, and referring to FIGS. 48, 49, and 49A, a construction 10*d* comprises a first oxide-comprising material (e.g., 45). Like numerals from the above-described embodiments have been used where appropriate, with some construction differences being indicated with the suffix "d" or with different numerals. The first oxide-comprising material is directly against first-material longitudinal sidewalls (e.g., 43) and first-material bottoms (e.g., 44) of the upper masses (e.g., 39), with the first oxide-comprising material being of different composition from that of the first material (e.g., 35), Second material (e.g., 57, and which may be insulative, conductive, and/or semiconductive) is laterally-between and longitudinally-spaced-along the immediately-laterally-adjacent memory blocks longitudinally-between the upper masses and the first oxide-comprising material that is directly against the first-material longitudinal sidewalls of the upper masses. The second material is of different composition from that of the first oxide-comprising material. Third material (e.g., 31*d*) is under the upper masses and the first oxide-comprising material that is directly against the first-material bottoms of the upper masses. The third material is of different composition from that of the first oxide-comprising material, and comprises insulative material (e.g., silicon nitride, a semi-metal insulative oxide, and/or an insulative metal oxide). A second oxide-comprising material (e.g., 51; e.g., and which may result by exposure of construction 10*d* to room-ambient air and/or other oxygen-containing ambient or that may be otherwise formed/deposited) is directly against longitudinal sidewalls (e.g., 70) of the third material, with the second oxide-comprising material being of different composition from that of the third material. In one embodiment, the first and second oxide-comprising materials are of the same composition relative one another, and in another embodiment are of different compositions relative one another. In one embodiment, the third and first materials are of the same composition relative one another, and in another embodiment are of different compositions relative one another. In one embodiment, the second and first materials are of the same composition relative one another, and in another embodiment are of different compositions relative one another. Any other attribute(s) or aspect(s) as shown and/or described herein with respect to other embodiments may be used.

Figure 50:
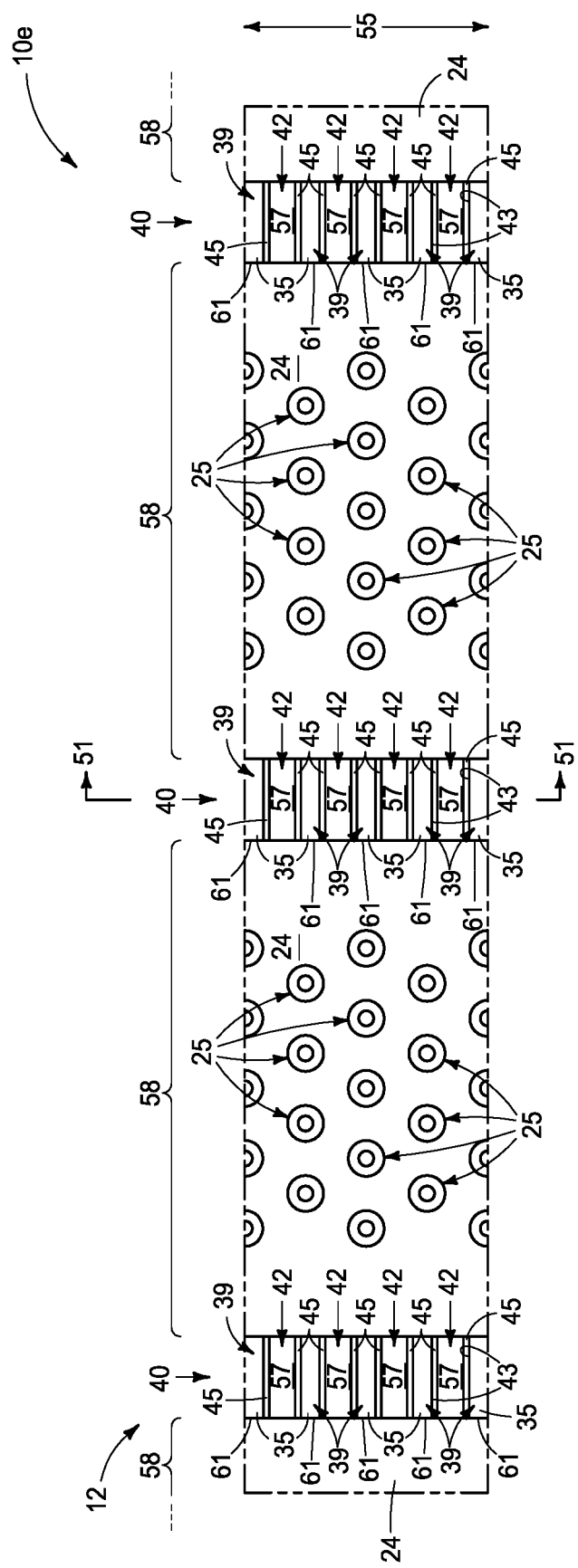

In one embodiment, and referring to FIGS. 50, 51, and 51A, a construction 10*e* comprises a first oxide-comprising material (e.g., 45), Like numerals from the above-described embodiments have been used where appropriate, with some construction differences being indicated with the suffix "e". The first oxide-comprising material is directly against first-material longitudinal sidewalls (e.g., 43) of the upper masses (e.g., 39). The first oxide-comprising material is of different composition from that of the first material (e.g., 35). Second material (e.g., 57, and which may be insulative, conductive, and/or semiconductive) is laterally-between and longitudinally-spaced-along the immediately-laterally-adjacent memory blocks longitudinally-between the upper masses and the first oxide-comprising material that is directly against the first-material longitudinal sidewalls of the upper masses. The second material is of different composition from that of the first oxide-comprising material. Third material (e.g., 31*e*) is under and directly against first-material bottoms (e.g., 44) of the upper masses. The third material is of different composition from that of each of the first material and the first oxide-comprising material. A second oxide-comprising material (e.g., 51) is directly against longitudinal sidewalls (e.g., 70) of the third material. The second oxide-comprising material is of different composition from that of the third material. Any other attribute(s) or aspect(s) as shown and/or described herein with respect to other embodiments may be used.

In one embodiment, second material (e.g., 57) is laterally-between and longitudinally-spaced-along the immediately-laterally-adjacent memory blocks (e.g., 58) longitudinally-between and under the upper masses. The second material is of different composition from that of the first material (e.g., 35) and comprises insulative material. In one embodiment, upper masses (e.g., 39) individually comprise a six-flat-sided block of the first material. In one embodiment, the second material is directly against first-material longitudinal sidewalls (e.g., 43) of the upper masses and in one embodiment is directly against first-material bottoms (e.g., 44) of the upper masses. In one embodiment, the first material is conductive, in another embodiment is insulative, and in still another embodiment is semiconductive. Any other attribute(s) or aspect(s) as shown and/or described herein with respect to other embodiments may be used.

In one embodiment, an oxide-comprising material (e.g., 45) is against, in one embodiment directly against, first-material longitudinal sidewalls (e.g., 43) of the upper masses (e.g., 39). The oxide-comprising material is of different composition from that of the first material (e.g., 35). Second material (e.g., 57) is laterally between and longitudinally-spaced-along the immediately-laterally-adjacent memory blocks (e.g., 58) longitudinally-between the upper masses and the oxide-comprising material. Third material (e.g., 31*c*) is under the upper masses, is of different composition from that of at least one of the first material and the oxide-comprising material, and comprises insulative material. In one embodiment, the third and first materials are of the same composition relative one another, and in another embodiment are of different compositions relative one another. In one embodiment, the third and second materials are of different compositions relative one another, and in one embodiment the second and first materials are of different compositions relative one another. In one embodiment, the oxide-comprising material is under the upper masses, and in one such embodiment is directly against bottoms (e.g., 44)

of the upper masses. Any other attribute(s) or aspect(s) as shown and/or described herein with respect to other embodiments may be used.

In one embodiment, second material (e.g., 57) is laterally-between and longitudinally-spaced-along the immediately-laterally-adjacent memory blocks (e.g., 58) longitudinally-between the upper masses (e.g., 39), with the second material being of different composition from that of the first material. Third material (e.g., 31c, 31d, 31e) is under the upper masses, is of different composition from that of each of the first material and the second material, and comprises insulative material. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Upper masses comprise first material laterally-between and longitudinally-spaced-along immediately-laterally-adjacent of the memory blocks and second material laterally-between and longitudinally-spaced-along the immediately-laterally-adjacent memory blocks longitudinally-between and under the upper masses. The second material is of different composition from that of the first material. The second material comprises insulative material.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Upper masses of first material are laterally-between and longitudinally-spaced-along immediately-laterally-adjacent of the memory blocks. An oxide-comprising material is against first-material longitudinal sidewalls of the upper masses. The oxide-comprising material is of different composition from that of the first material. Second material is laterally-between and longitudinally-spaced-along the immediately-laterally-adjacent memory blocks longitudinally-between the upper masses and the oxide-comprising material. A third material is under the upper masses. The third material is of different composition from that of at least one of the first material and the oxide-comprising material. The third material comprises insulative material.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Upper masses comprising first material are laterally-between and longitudinally-spaced-along immediately-laterally-adjacent of the memory blocks. A second material is laterally-between and longitudinally-spaced-along the immediately-laterally-adjacent memory blocks longitudinally-between the upper masses. The second material is of different composition from that of the first material. A third material is under the upper masses. The third material is of different composition from that of each of the first material and the second material. The third material comprises insulative material.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Upper masses comprising first material are laterally-between and longitudinally-spaced-along immediately-laterally-adjacent of the memory blocks. A first oxide-comprising material is directly against first-material longitudinal sidewalls and first-material bottoms of the upper masses. The first oxide-comprising material is of different composition from that of the first material. A second material is laterally-between and longitudinally-spaced-along the immediately-laterally-adjacent memory blocks longitudinally-between the upper masses and the first oxide-comprising material that is directly against the first-material longitudinal sidewalls of the upper masses. The second material is of different composition from that of the first oxide-comprising material. A third material is under the upper masses and the first oxide-comprising material that is directly against the first-material bottoms of the upper masses. The third material is of different composition from that of the first oxide-comprising material. The third material comprises insulative material. A second oxide-comprising material is directly against longitudinal sidewalls of the third material. The second oxide-comprising material is of different composition from that of the third material.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Upper masses comprising first material are laterally-between and longitudinally-spaced-along immediately-laterally-adjacent of the memory blocks. A first oxide-comprising material is directly against first-material longitudinal sidewalls of the upper masses. The first oxide-comprising material is of different composition from that of the first material. A second material is laterally-between and longitudinally-spaced-along the immediately-laterally-adjacent memory blocks longitudinally-between the upper masses and the first oxide-comprising material that is directly against the first-material longitudinal sidewalls of the upper masses. The second material is of different composition from that of the first oxide-comprising material. A third material is under and directly against first-material bottoms of the upper masses. The third material is of different composition from that of each of the first material and the first oxide-comprising material. A second oxide-comprising material is directly against longitudinal sidewalls of the third material. The second oxide-comprising material is of different composition from that of the third material In some embodiments, a method used in forming a memory array comprising strings of memory cells comprises forming a stack comprising vertically-alternating first tiers and second tiers. Horizontally-elongated trenches are formed into the stack to form laterally-spaced memory-block regions. Upper masses are formed across and along the horizontally-elongated trenches to be laterally-between and longitudinally-spaced-along immediately-laterally-adjacent of the memory-block regions. A void space is below the upper masses in the horizontally-elongated trenches between the laterally-spaced memory-block regions.

In some embodiments, a method used in forming a memory array comprising strings of memory cells comprises forming a stack comprising vertically-alternating first tiers and second tiers. Horizontally-elongated trenches are formed into the stack to form laterally-spaced memory-block regions. Pillars are formed laterally-between and longitudinally-spaced-along immediately-laterally-adjacent of the memory blocks. The pillars comprise an upper first material and a second material below the first material. The first and second materials are of different compositions relative one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
    laterally-spaced memory blocks individually comprising a vertical stack comprising alternating insulative tiers and conductive tiers, operative channel-material strings of memory cells extending through the insulative tiers and the conductive tiers;
    upper masses comprising first material laterally-between and longitudinally-spaced-along immediately-laterally-adjacent of the memory blocks, the upper masses individually comprising a bottom that is above an uppermost of the conductive tiers; and
    second material laterally-between and longitudinally-spaced-along the immediately-laterally-adjacent memory blocks longitudinally-between the upper masses, the second material being in the uppermost conductive tier and directly under the bottoms of the upper masses, the second material being of different composition from that of the first material, the second material comprising insulative material.

2. The memory array of claim 1 wherein the respective upper masses comprise a top planar surface that is coplanar with a top planar surface of the vertical stack.

3. The memory array of claim 1 wherein the upper masses individually comprise a six-flat-sided block of the first material.

4. The memory array of claim 1 wherein the second material is directly against first-material longitudinal sidewalls of the upper masses.

5. The memory array of claim 1 wherein the second material is directly against the bottoms of the upper masses.

6. The memory array of claim 1 wherein the first material is conductive.

7. The memory array of claim 1 wherein the first material is insulative.

8. The memory array of claim 1 wherein the first material is semiconductive.

9. The memory array of claim 1 comprising NAND.

10. A memory array comprising strings of memory cells, comprising:
    laterally-spaced memory blocks individually comprising a vertical stack comprising alternating insulative tiers and conductive tiers, operative channel-material strings of memory cells extending through the insulative tiers and the conductive tiers;
    upper masses of first material laterally-between and longitudinally-spaced-along immediately-laterally-adjacent of the memory blocks, the upper masses individually comprising a bottom that is above an uppermost of the conductive tiers;
    an oxide-comprising material against first-material longitudinal sidewalls of the upper masses, the oxide-comprising material being of different composition from that of the first material;
    second material laterally-between and longitudinally-spaced-along the immediately-laterally-adjacent memory blocks longitudinally-between the upper masses and the oxide-comprising material; and
    third material directly under the upper masses, the third material being of different composition from that of at least one of the first material and the oxide-comprising material, the third material comprising insulative material, the third material being in the uppermost conductive tier and directly under the bottoms of the upper masses.

11. The memory array of claim 10 wherein the oxide-comprising material comprises a continuous layer over the first-material longitudinal sidewalls of the upper masses.

12. The memory array of claim 10 wherein the oxide-comprising material comprises a discontinuous layer over the first-material longitudinal sidewalls of the upper masses.

13. The memory array of claim 10 wherein the third and first materials are of the same composition relative one another.

14. The memory array of claim 10 wherein the third and first materials are of different compositions relative one another.

15. The memory array of claim 10 wherein the third and second materials are of different compositions relative one another.

16. The memory array of claim 10 wherein the second and first materials are of different compositions relative one another.

17. The memory array of claim 10 wherein the oxide-comprising material is directly against the first-material longitudinal sidewalls of the upper masses.

18. The memory array of claim 10 wherein the oxide-comprising material is directly under the upper masses.

19. The memory array of claim 18 wherein the oxide-comprising material is directly against the bottoms of the upper masses.

20. The memory array of claim 19 wherein the oxide-comprising material is directly against the first-material longitudinal sidewalls of the upper masses.

21. A memory array comprising strings of memory cells, comprising:
laterally-spaced memory blocks individually comprising a vertical stack comprising alternating insulative tiers and conductive tiers, operative channel-material strings of memory cells extending through the insulative tiers and the conductive tiers;
upper masses comprising first material laterally-between and longitudinally-spaced-along immediately-laterally-adjacent of the memory blocks, the upper masses individually comprising a bottom that is above an uppermost of the conductive tiers;
second material laterally-between and longitudinally-spaced-along the immediately-laterally-adjacent memory blocks longitudinally-between the upper masses, the second material being of different composition from that of the first material; and
third material directly under the upper masses, the third material being of different composition from that of each of the first material and the second material, the third material comprising insulative material, the third material being in the uppermost conductive tier and directly under the bottoms of the upper masses.

22. A memory array comprising strings of memory cells, comprising:
laterally-spaced memory blocks individually comprising a vertical stack comprising alternating insulative tiers and conductive tiers, operative channel-material strings of memory cells extending through the insulative tiers and the conductive tiers;
upper masses comprising first material laterally-between and longitudinally-spaced-along immediately-laterally-adjacent of the memory blocks, the upper masses individually comprising a first-material bottom that is above an uppermost of the conductive tiers;
a first oxide-comprising material directly against first-material longitudinal sidewalls and the first-material bottoms of the upper masses, the first oxide-comprising material being of different composition from that of the first material;
second material laterally-between and longitudinally-spaced-along the immediately-laterally-adjacent memory blocks longitudinally-between the upper masses and the first oxide-comprising material that is directly against the first-material longitudinal sidewalls of the upper masses, the second material being of different composition from that of the first oxide-comprising material;
third material directly under the upper masses and the first oxide-comprising material that is directly against the first-material bottoms of the upper masses, the third material being of different composition from that of the first oxide-comprising material, the third material comprising insulative material, the third material being in the uppermost conductive tier and directly under the first-material bottoms of the upper masses; and
a second oxide-comprising material directly against longitudinal sidewalls of the third material, the second oxide-comprising material being of different composition from that of the third material.

23. A memory array comprising strings of memory cells, comprising:
laterally-spaced memory blocks individually comprising a vertical stack comprising alternating insulative tiers and conductive tiers, operative channel-material strings of memory cells extending through the insulative tiers and the conductive tiers;
upper masses comprising first material laterally-between and longitudinally-spaced-along immediately-laterally-adjacent of the memory blocks, the upper masses individually comprising a first-material bottom that is above an uppermost of the conductive tiers;
a first oxide-comprising material directly against first-material longitudinal sidewalls of the upper masses, the first oxide-comprising material being of different composition from that of the first material;
second material laterally-between and longitudinally-spaced-along the immediately-laterally-adjacent memory blocks longitudinally-between the upper masses and the first oxide-comprising material that is directly against the first-material longitudinal sidewalls of the upper masses, the second material being of different composition from that of the first oxide-comprising material;
third material directly under and directly against the first-material bottoms of the upper masses, the third material being of different composition from that of each of the first material and the first oxide-comprising material, the third material being in the uppermost conductive tier and directly under the first-material bottoms of the upper masses; and
a second oxide-comprising material directly against longitudinal sidewalls of the third material, the second oxide-comprising material being of different composition from that of the third material.

24. The memory array of claim 21 wherein the third material is directly against the first-material bottoms of the upper masses.

25. The memory array of claim 21 wherein the third material is not directly against the first-material bottoms of the upper masses.

26. The memory array of claim 21 wherein the second material is directly against first-material longitudinal sidewalls of the upper masses.

27. The memory array of claim 21 wherein the second material is not directly against first-material longitudinal sidewalls of the upper masses.

28. The memory array of claim 22 wherein the first and second oxide-comprising materials are of the same composition relative one another.

29. The memory array of claim 22 wherein the first and second oxide-comprising materials are of different compositions relative one another.

30. The memory array of claim 22 wherein the third and first materials are of the same composition relative one another.

31. The memory array of claim 22 wherein the third and first materials are of different compositions relative one another.

32. The memory array of claim 22 wherein the second and first materials are of the same composition relative one another.

33. The memory array of claim 22 wherein the second and first materials are of different compositions relative one another.

* * * * *